United States Patent
Okuno

(10) Patent No.: US 12,501,650 B2
(45) Date of Patent: Dec. 16, 2025

(54) SILICON CARBIDE SEMICONDUCTOR DEVICE AND METHOD FOR MANUFACTURING SILICON CARBIDE SEMICONDUCTOR DEVICE

(71) Applicant: Mitsubishi Electric Corporation, Tokyo (JP)

(72) Inventor: Koji Okuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 506 days.

(21) Appl. No.: 17/826,614

(22) Filed: May 27, 2022

(65) Prior Publication Data
US 2023/0034063 A1 Feb. 2, 2023

(30) Foreign Application Priority Data
Aug. 2, 2021 (JP) .................... 2021-126563

(51) Int. Cl.
*H10D 30/66* (2025.01)
*H01L 21/04* (2006.01)
*H10D 62/832* (2025.01)

(52) U.S. Cl.
CPC ......... *H10D 30/665* (2025.01); *H01L 21/049* (2013.01); *H10D 62/8325* (2025.01)

(58) Field of Classification Search
CPC ............. H01L 29/7811; H01L 21/049; H01L 29/1608; H01L 29/16; H01L 29/0619; H01L 29/4238; H01L 29/7815; H01L 29/861; H10D 30/665; H10D 62/8325; H10D 8/00; H10D 30/669; H10D 62/83; H10D 62/106; H10D 64/519
See application file for complete search history.

(56) References Cited

U.S. PATENT DOCUMENTS

| 2012/0061688 | A1 | 3/2012 | Watanabe et al. | |
| 2017/0221998 | A1* | 8/2017 | Ebihara | H10D 30/655 |
| 2021/0376142 | A1* | 12/2021 | Nakamura | H10D 62/153 |

FOREIGN PATENT DOCUMENTS

| DE | 11 2009 005 069 B4 | 9/2016 | |
| JP | 2016-058498 A | 4/2016 | |
| JP | 6580270 B2 * | 9/2019 | H01L 29/06 |
| WO | 2011/007387 A1 | 1/2011 | |
| WO | 2018/038133 A1 | 3/2018 | |

OTHER PUBLICATIONS

J Bühler et al 1997 J. Micromech. Microeng. 7 R1. (Year: 1997).*
Machine translation of JP-6580270 (Year: 2018).*

(Continued)

*Primary Examiner* — J. E. Schoenholtz
(74) *Attorney, Agent, or Firm* — Studebaker Brackett PLLC

(57) ABSTRACT

A MOSFET includes a gate electrode and an etching stopper layer formed on a field insulating film of a gate pad region, and an interlayer insulating film formed on the gate electrode and the etching stopper layer. The etching stopper layer is made from a substance having a selectivity of 5.0 or more with respect to etching of the interlayer insulating film and the field insulating film, and is provided at a position farthest from the well contact hole of the under-gate well contact region at least in the gate pad region.

17 Claims, 34 Drawing Sheets

(56) References Cited

OTHER PUBLICATIONS

An Office Action; "Notice of Reasons for Refusal," mailed by the Japanese Patent Office on May 14, 2024, which corresponds to Japanese Patent Application No. 2021-126563 and is related to U.S. Appl. No. 17/826,614; with English language translation.

An Office Action issued by the German Patent and Trademark Office on Apr. 9, 2024, which corresponds to German Patent Application No. 102022117772.6 and is related to U.S. Appl. No. 17/826,614; with English language translation.

An Office Action mailed by China National Intellectual Property Administration on May 23, 2025, which corresponds to Chinese Patent Application No. 202210904053.0 and is related to U.S. Appl. No. 17/826,614; with English language translation.

* cited by examiner

F I G. 1
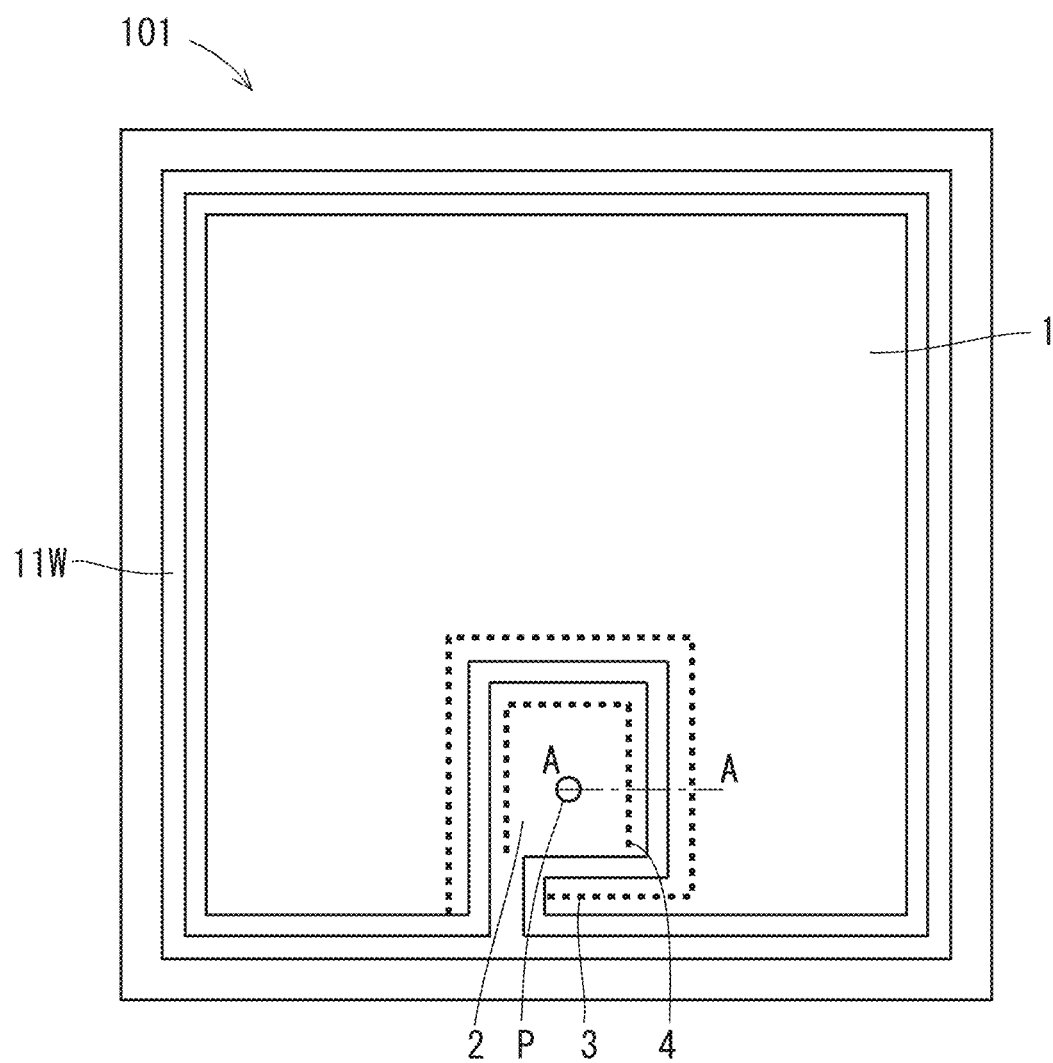

F I G. 2
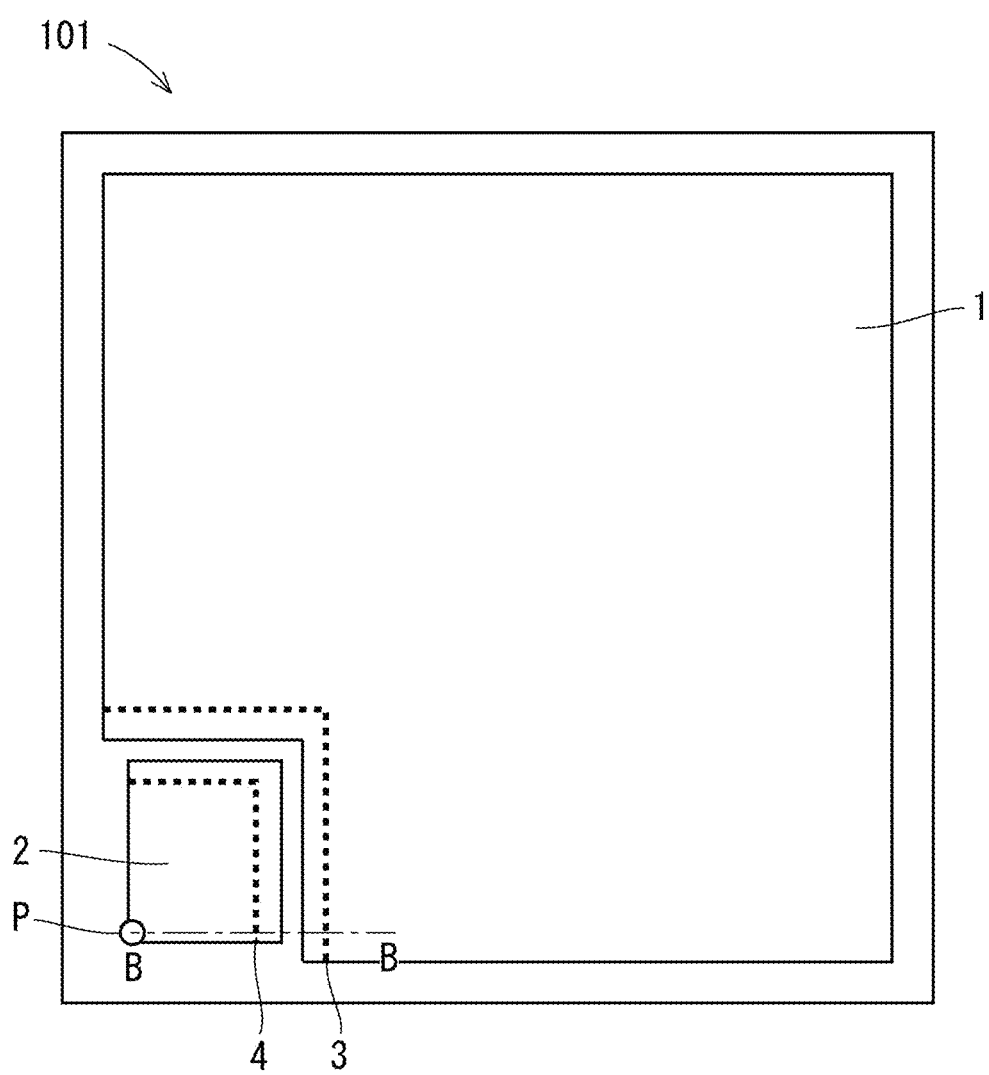

F I G. 4
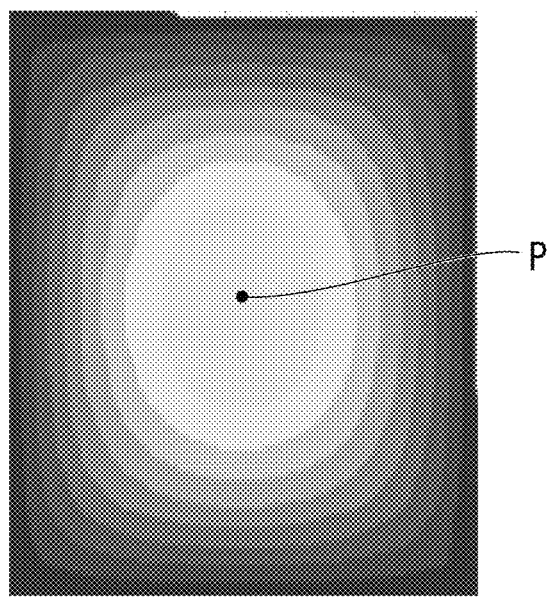

F I G. 1 9
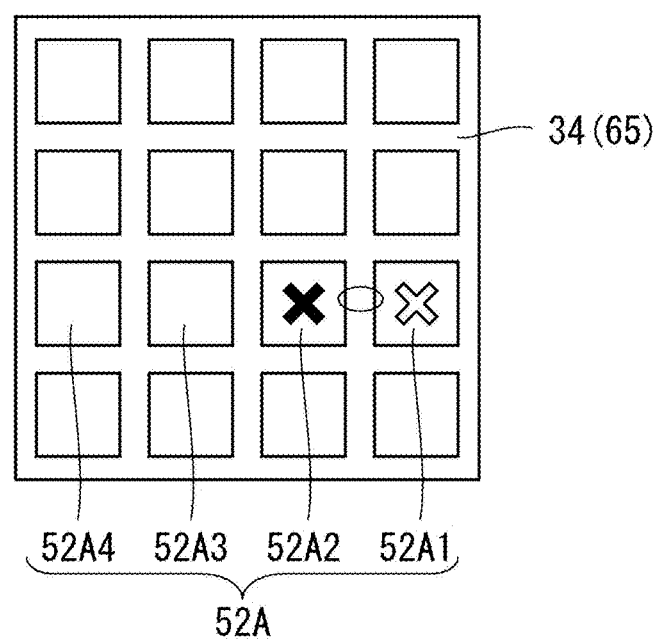

F I G. 2 1
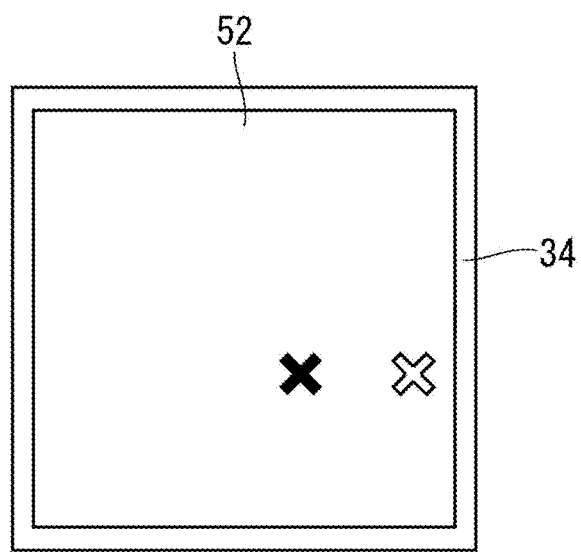

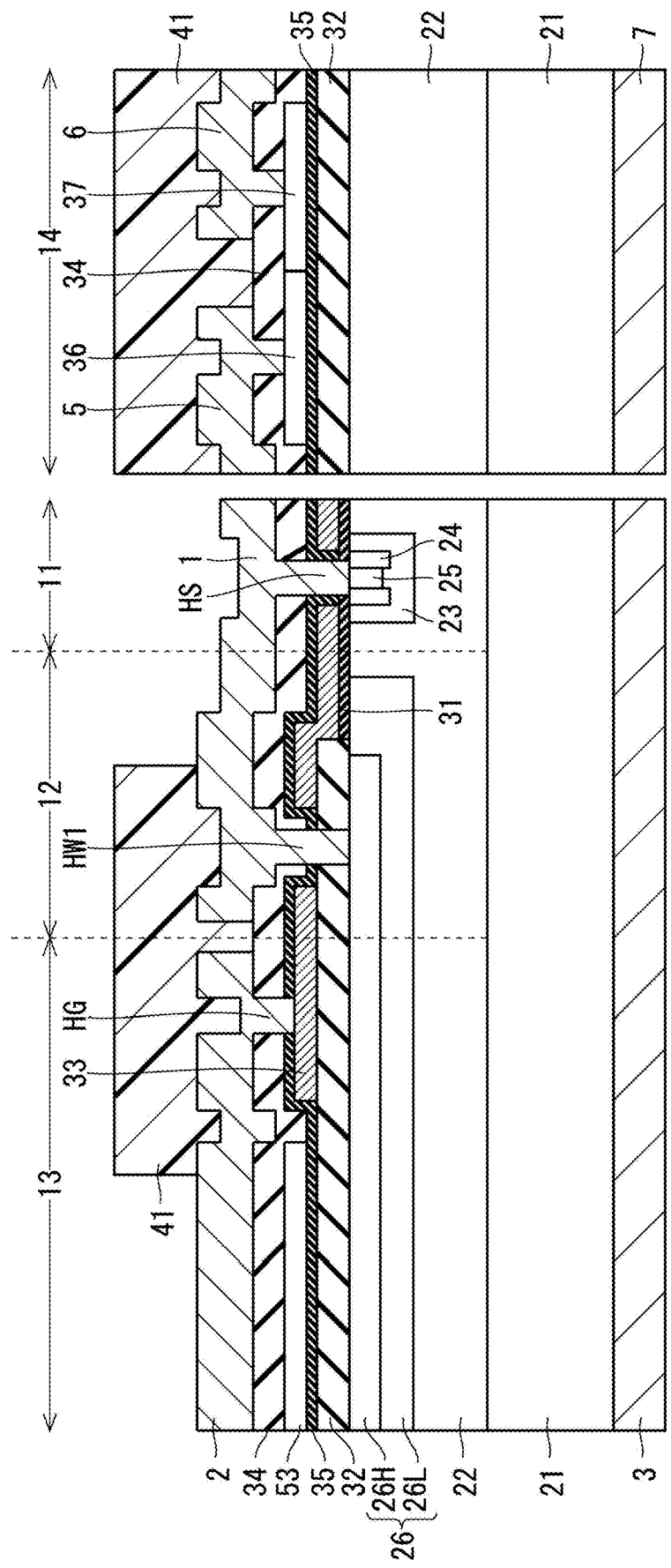

F I G. 2 8
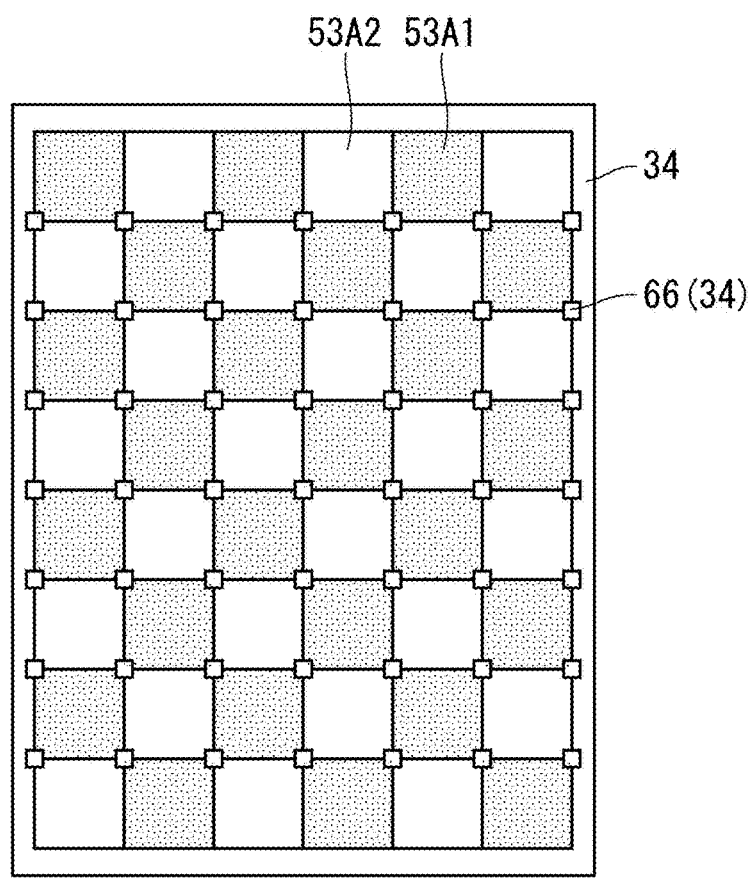

F I G. 2 9
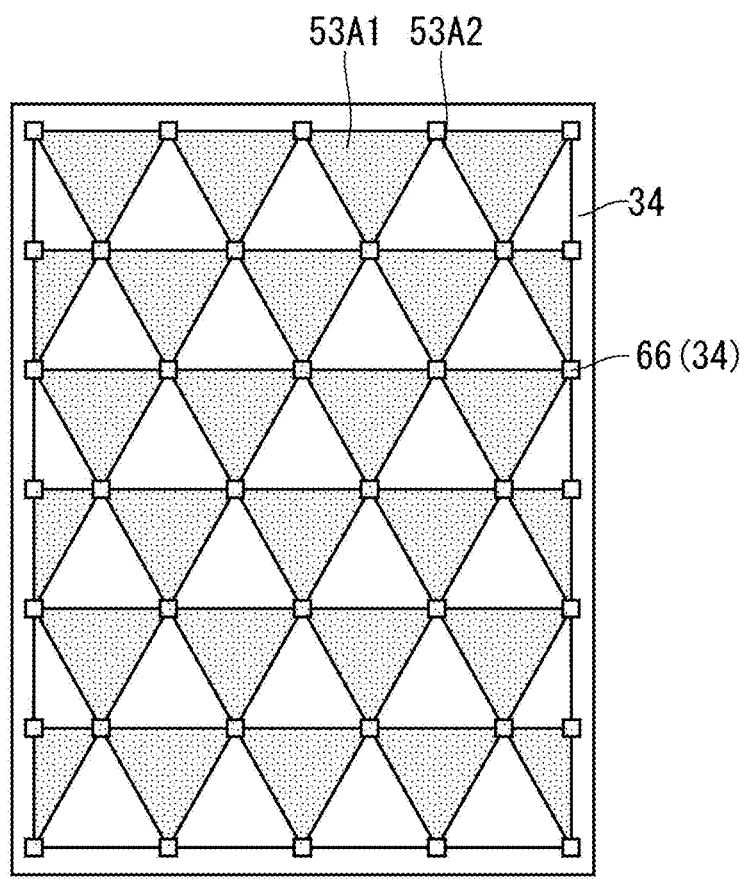

SILICON CARBIDE SEMICONDUCTOR DEVICE AND METHOD FOR MANUFACTURING SILICON CARBIDE SEMICONDUCTOR DEVICE

BACKGROUND OF THE INVENTION

Field of the Invention

The present disclosure relates to a silicon carbide semiconductor device.

Description of the Background Art

In a semiconductor device such as a metal oxide semiconductor field effect transistor (MOSFET) that is vertical and has a gate structure, a terminal is connected to a gate pad region by wire bonding or the like, so that a region that is wide to some extent is secured. Under the gate pad region at the time of reverse bias, displacement current flows toward the under-gate well contact installed outside the gate pad region and depletion occurs, and withstand voltage is maintained at a PN junction in a silicon carbide semiconductor. However, during high-speed operation (application of high dV/dt) required in the silicon carbide semiconductor device, a high electric field is applied to an insulating film because voltage is applied before depletion is completed.

WO 2018-038133 A discloses a configuration in which a capacitor including a thin oxide film and a conductor is provided on a semiconductor surface below a gate pad region. In this manner, an electric field applied to an insulating film when high dV/dt is applied is reduced.

In a conventional semiconductor device including the structure disclosed in WO 2018-038133 A, a film having a thickness that does not cause dielectric breakdown even when high dV/dt is applied is formed as long as the film is formed without a defect. However, in a case where a defect of an insulating film occurs due to a process defect such as mixing of a foreign matter, and the insulating film becomes thin, there is a possibility that dielectric breakdown occurs when high dV/dt is applied. Further, in order to reject a semiconductor device with a thinned insulating film by an electrical test in a subsequent process, it is necessary to perform a test to which high dV/dt is applied, and thus, there is a possibility that dielectric breakdown occurs.

SUMMARY

An object of the present disclosure is to suppress occurrence of dielectric breakdown when high dV/dt is applied even if a process defect occurs in a silicon carbide semiconductor device.

The silicon carbide semiconductor device of the present disclosure is divided into a plurality of regions including a device region, a gate pad region, and an under-gate well contact region in plan view.

A switching element is formed in the device region.

A gate pad is formed in the gate pad region.

The under-gate well contact region is a region between the device region and the gate pad region.

The silicon carbide semiconductor device according to the present disclosure includes a semiconductor layer made from silicon carbide.

The semiconductor layer includes a drift layer of a first conductivity type, a well region, a field insulating film, a gate electrode, an etching stopper layer, an interlayer insulating film, a surface electrode, and a gate pad.

The well region is formed on a surface layer of the drift layer over the gate pad region and the under-gate well contact region.

The field insulating film is formed on an upper surface of the semiconductor layer in the gate pad region.

The gate electrode and the etching stopper layer are formed on the field insulating film in the gate pad region.

The interlayer insulating film is formed on the gate electrode and the etching stopper layer.

The surface electrode is formed on the interlayer insulating film in the under-gate well contact region, and is in contact with the well region via a well contact hole penetrating the field insulating film and the interlayer insulating film.

The gate pad is formed on the interlayer insulating film in the gate pad region, and is in contact with the gate electrode via a gate contact hole penetrating the interlayer insulating film.

The etching stopper layer is made from a substance having a selectivity of 5.0 or more with respect to etching of the interlayer insulating film and the field insulating film, and is provided at a position farthest from the well contact hole of the under-gate well contact region at least in the gate pad region.

According to the silicon carbide semiconductor device of the present disclosure, even if a defect occurs in at least one of the field insulating film and the interlayer insulating film in a region where a highest electric field is applied, insulating performance can be maintained by the etching stopper layer.

As a result, dielectric breakdown at the time of application of high dV/dt can be suppressed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view of a first pattern of a MOSFET according to a first preferred embodiment;

FIG. 2 is a plan view of a second pattern of the MOSFET of the first preferred embodiment;

FIG. 4 is a diagram illustrating a simulation result of potential distribution generated when high dV/dt is applied in a gate pad region of the MOSFET of the first pattern;

FIG. 19 is a plan view illustrating an etching stopper layer and an interlayer insulating film corresponding to FIG. 18;

FIG. 21 is a plan view illustrating the etching stopper layer and the interlayer insulating film corresponding to FIG. 20;

FIGS. 24A to 26B are cross-sectional views each illustrating a manufacturing process of the device region, the under-gate well contact region, the gate pad region, and the temperature sense diode region of the MOSFET of the third preferred embodiment;

FIGS. 28 and 29 are plan views each illustrating the etching stopper layer in the MOSFET in a variation of the third preferred embodiment;

DESCRIPTION OF THE PREFERRED EMBODIMENTS

In description below, as a conductivity type of a semiconductor, an n-type is referred to as a first conductivity type, and a p-type is referred to as a second conductivity type. However, these conductivity types may be opposite. Further, the n-type indicates that an n-type impurity concentration is lower than that of the n-type, and an N+-type indicates that an n-type impurity concentration is higher than that of the n-type. Similarly, the p-type indicates that a p-type impurity concentration is lower than that of the p-type, and a P+-type indicates that a p-type impurity concentration is higher than that of the p-type.

A. First Preferred Embodiment

A-1. Configuration

Figure 3:
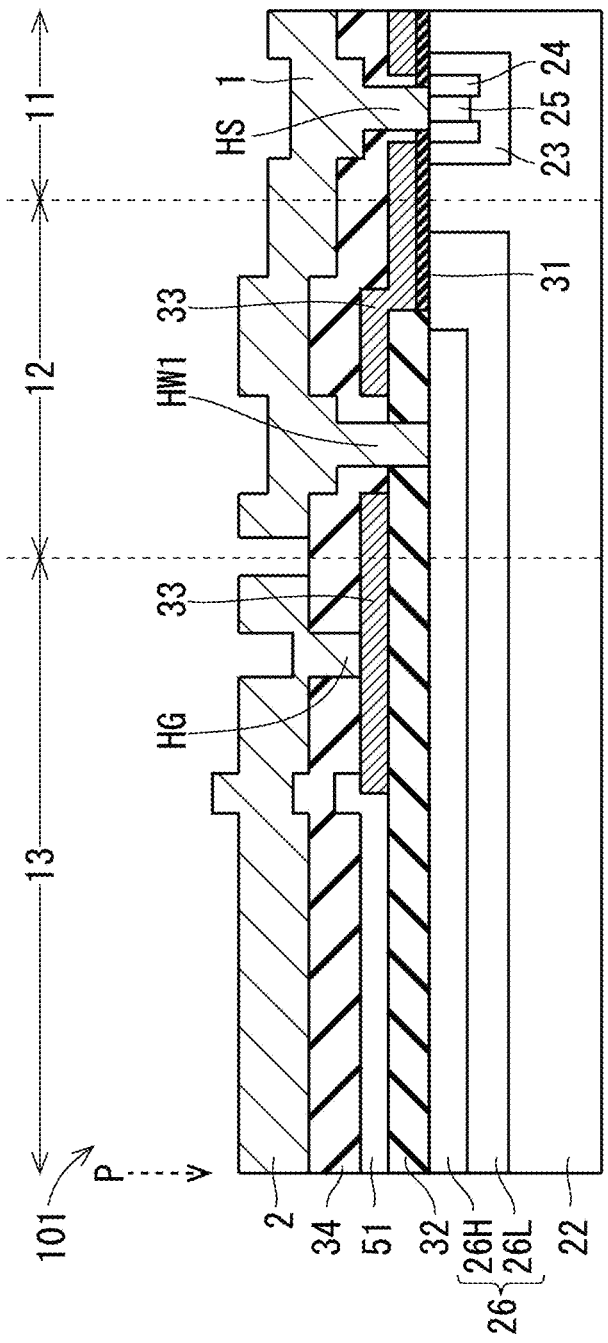
FIG. 3 is a cross-sectional view of the MOSFET of the first preferred embodiment.

FIG. 1 is a plan view of a first pattern of a MOSFET 101 that is a silicon carbide semiconductor device according to a first preferred embodiment. FIG. 2 is a plan view of a second pattern of the MOSFET 101. FIG. 3 is a cross-sectional view of the MOSFET 101 taken along line A-A in FIG. 1 or line B-B in FIG. 2. In FIGS. 1 and 2, a broken line 3 indicates the position of a well contact hole HW1, and a broken line 4 indicates the position of a gate contact hole HG. Further, a point P indicates a point in the gate pad region 13 farthest from an under-gate well contact region 12, in other words, the well contact hole HW1.

The MOSFET 101 includes a source electrode 1 and a gate pad 2. The gate pad 2 may be provided at the center of one side of a chip as illustrated in FIG. 1, or may be provided at a corner of the chip as illustrated in FIG. 2. The source electrode 1 and the gate pad 2 are made from, for example, Al. For example, polyimide or the like is formed as a protective film of a semiconductor device between a terminal portion of the chip and an electrode.

As illustrated in FIG. 3, the MOSFET 101 includes an n-type drift layer 22. The drift layer 22 is formed on an n-type SiC substrate by epitaxial growth. However, the SiC substrate is not illustrated in FIG. 3. The impurity concentration of the drift layer 22 is lower than the impurity concentration of the SiC substrate, and is, for example, $1 \times 10^{13}$ cm$^{-3}$ or more and $1 \times 10^{18}$ cm$^{-3}$ or less. The thickness of the drift layer 22 is, for example, 4 µm or more and 200 µm or less. On a lower surface of the SiC substrate, a drain electrode (not illustrated in FIG. 3) is provided as a back electrode by a sputtering method, a plating method, or the like. When the back electrode is formed, the SiC substrate is ground so as to have a desired film thickness of, for example, 100 µm or more and 300 µm or less. Then, after Ni or Ti is deposited on the lower surface of the SiC substrate, the deposited Ni or Ti are subjected to annealing treatment at a temperature of 800° C. or more and 1000° C. or less to be converted into a silicide. As a result, a low resistance contact is obtained. Finally, a material (for example, Ni, Au, or the like in a case of solder bonding) required for base bonding is deposited on Ni or Ti.

The cross-sectional structure of the MOSFET 101 illustrated in FIG. 3 is divided into a device region 11, an under-gate well contact region 12, and a gate pad region 13 in plan view. A region where the gate pad 2 is formed is referred to as the gate pad region 13. In a region where the source electrode 1 is formed, a region adjacent to the gate pad region 13 is defined as the under-gate well contact region 12, and the other regions is defined as the device region 11.

On a surface layer of the drift layer 22, a p-type first well region 23 is provided in the device region 11, and a second well region 26 is provided in the under-gate well contact region 12 and the gate pad region 13. The second well region 26 includes a p-type well body region 26L formed on the surface layer of the drift layer 22 in the under-gate well contact region 12 and the gate pad region 13, and a P+-type well contact region 26H formed on a surface layer of the well body region 26L on the under-gate well contact region 12 and the gate pad region 13. The well contact region 26H is also referred to as a well low resistance layer.

An n-type source region 24 is provided on a surface layer of the first well region 23. Further, an N+-type well contact region 25 that penetrates the source region 24 from a surface of the source region 24 and reaches the first well region 23 is provided.

A gate insulating film 31 is provided on the first well region 23 and its periphery and on an end portion close to the device region 11 of the second well region 26. As illustrated in FIG. 3, the gate insulating film 31 may be provided on the drift layer 22 between the first well region 23 and the second well region 26. Further, the gate insulating film 31 may be provided on the source region 24. The gate insulating film 31 is formed by, for example, a thermal oxidation method or a deposition method. The thermal oxidation method is performed in an oxidation system gas atmosphere such as a wet atmosphere, an oxygen (O2) atmosphere, or a nitrogen oxide (NO or N2O) atmosphere. The deposition method may be performed using a high dielectric constant material, that is called a "high-k material".

A field insulating film 32 is provided in a region of an upper surface of the second well region 26 where the gate insulating film 31 is not provided. The field insulating film 32 is provided in the gate pad region 13 and the under-gate well contact region 12. The field insulating film 32 is thicker than the gate insulating film 31. Similarly to the gate insulating film 31, the field insulating film 32 is formed by, for example, a thermal oxidation method or a deposition method. The field insulating film 32 is made from, for example, tetraethyl orthosilicate (TEOS).

A gate electrode 33 is provided on the gate insulating film 31 and the field insulating film 32. A surface layer of the first well region 23 sandwiched between the source region 24 and the drift layer 22 is a channel region. The gate electrode 33 has a portion arranged on the channel region with the gate insulating film 31 interposed between them. The gate electrode 33 is formed by, for example, film formation by a CVD method and patterning using a photolithography technique. For the film formation, for example, a polycrystalline silicon material is used. The polycrystalline silicon used desirably has a low resistance by containing a P atom or a B atom. Impurities such as P or B may be introduced during the formation of the polycrystalline silicon film, or may be introduced by an ion implantation method or the like after the formation of the film. The gate electrode 33 may be a multi-region film made from polycrystalline silicon and metal, a multi-region film made from polycrystalline silicon and metal silicide, or a metal film. An outermost peripheral end surface of the gate electrode 33 is preferably arranged not on the gate insulating film 31 but on the field insulating film 32. In this manner, it is possible to prevent quality deterioration due to etching of the gate insulating film 31 in the vicinity of the outermost peripheral end surface of the gate electrode 33 by over-etching in dry etching processing for patterning the gate electrode 33.

On the field insulating film 32, an etching stopper layer 51 is provided in addition to the gate electrode 33. An interlayer insulating film 34 is provided on the gate electrode 33 and the etching stopper layer 51 so as to cover them. In the device region 11, a source contact hole HS is formed on the interlayer insulating film 34. The source contact hole HS overlaps an opening portion of the gate insulating film 31 and is located on the source region 24 and the well contact region 25. Therefore, the source electrode 1 is in contact with the source region 24 and the well contact region 25 through the source contact hole HS. In the under-gate well contact region 12, a well contact hole HW1 (first well contact hole) is formed on the interlayer insulating film 34. The well contact hole HW1 penetrates the field insulating film 32 and reaches the well contact region 26H. Therefore, the source electrode 1 is in contact with the well contact region 26H through the well contact hole HW1. In the gate pad region 13, a gate contact hole HG is formed on the interlayer insulating film 34. The gate pad 2 is in contact with the gate electrode 33 through the gate contact hole HG. The interlayer insulating film 34 is made from, for example, an oxide or a silicon dioxide film. The interlayer insulating film 34 is formed by a deposition method such as a CVD method. The contact hole is formed using a photolithography technique and a dry etching technique.

The field insulating film 32 and the interlayer insulating film 34 are sufficiently thicker than the gate insulating film 31, and even a single film has a sufficient film thickness enough to have insulation tolerance to an electric field applied at the time of reverse bias in DC operation and high dV/dt (AC) operation in a region under the gate pad. The field insulating film 32 and the interlayer insulating film 34 desirably have a high insulation property of, for example, 8 MV/cm or more and 10 MV/cm or less like a TEOS oxide film, and can be deposited to having a thickness of 0.8 μm or more by CVD.

The gate pad 2 is connected to the gate electrode 33 through the gate contact hole HG of the interlayer insulating film 34. In the gate contact hole HG of the interlayer insulating film 34, an interface between the gate electrode 33 and the gate pad 2 is preferably converted into a silicide. In addition to the gate pad 2, a gate wiring portion 11w extending from the gate pad 2 may be provided. The gate wiring portion 11w is connected to the gate electrode 33 through the gate contact hole HG of the interlayer insulating film 34. The gate wiring portion 11w may surround the source electrode 1 in a planar layout. The gate pad 2 and the gate wiring portion 11w are electrically connected to the gate electrode 33 of a unit cell, so that gate voltage supplied from an external control circuit is applied to the gate electrode 33. The gate wiring portion 11w is made from Doped-PolySi or the like.

The source electrode 1 is connected to the source region 24 and the well contact region 25 through the source contact hole HS. Further, the source electrode 1 is connected to the second well region 26 through the well contact hole HW1. The source electrode 1 is typically arranged in a central portion in a planar layout. The source electrode 1 includes an ohmic electrode. The ohmic electrode is in contact with the source region 24 and the well contact region 25 in the source contact hole HS, and is in contact with the second well region 26 in the well contact hole HW1.

In the gate pad region 13, the etching stopper layer 51 is provided in at least a partial region between the interlayer insulating film 34 and the field insulating film 32. The etching stopper layer 51 is made from a material such as polysilicon or silicon nitride (SiN) having a higher selectivity (hereinafter, referred to as "etching selectivity") with respect to etching of the interlayer insulating film 34 and the field insulating film 32. The etching selectivity is obtained by dividing an etching rate of the interlayer insulating film 34 or the field insulating film 32 by an etching rate of the etching stopper layer 51 in a case where the interlayer insulating film 34 or the field insulating film 32 is used as a film to be etched and the etching stopper layer 51 is used as a mask. The etching selectivity is desirably at least 5.0 or more. In an etching process of the interlayer insulating film 34 or the field insulating film 32, the film thickness of the etching stopper layer 51 is desirably equal to or more than {(film thickness of the interlayer insulating film 34 or the field insulating film 32)/the etching selectivity}. When the etching selectivity is small, it is necessary to increase the film thickness of the etching stopper layer 51. As a result, a step between an upper surface of the gate electrode 33 exposed to the gate contact hole HG and an upper surface of the interlayer insulating film 34 increases, and it becomes difficult to embed the gate pad 2 in the gate contact hole HG.

The etching stopper layer 51 is provided in a region including the point P farthest from the under-gate well contact region 12, in other words, the well contact hole HW1 in the gate pad region 13. By providing the etching stopper layer 51, even in a case where a defect such as generation of a foreign matter occurs in a manufacturing process of the MOSFET 101 and at least one of the interlayer insulating film 34 and the field insulating film 32 has a defect it is possible to leave an insulating film having film thickness enough to withstand high dV/dt, and it is possible to suppress occurrence of dielectric breakdown when high dV/dt is applied. A reason for the above will be described below.

A-2. Etching Stopper Layer

Figure 5:
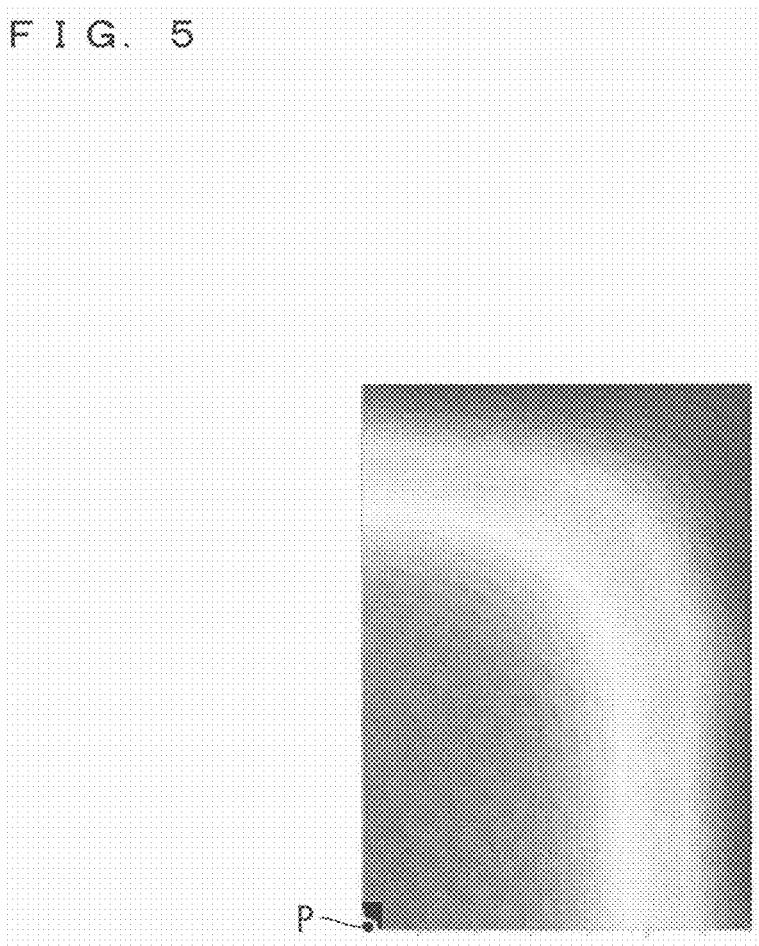
FIG. 5 is a diagram illustrating a simulation result of potential distribution generated when high dV/dt is applied in the gate pad region of the MOSFET of the second pattern.

FIG. 4 illustrates a simulation result of potential distribution generated when high dV/dt is applied in the gate pad region 13 of the MOSFET 101 of a first pattern. Further, FIG. 5 illustrates a simulation result of potential distribution generated when high dV/dt is applied in the gate pad region 13 of the MOSFET 101 of a second pattern. When a dV/dt application condition is 10 kV/μs and the size of the gate pad region 13 is about 1000 μm square, a maximum value of potential generated in the gate pad region 13 is 200 V or more and 300 V or less, which is larger than a gate operation voltage of about 15 V in general. Then, a location where potential becomes the highest is the point P farthest from the under-gate well contact region 12 in the gate pad region 13. Therefore, it is effective that the etching stopper layer 51 is provided in a location where potential becomes high including the point P.

When the etching stopper layer 51 is non-conductive such as silicon nitride (SiN), dielectric breakdown at the time of application of high dV/dt can be suppressed as long as no defect occurs in locations overlapping each other in plan view on the field insulating film 32 and the interlayer insulating film 34 formed in separate steps.

The etching stopper layer 51 alone may have sufficient film thickness to have insulation resistance to an electric field applied at the time of reverse bias in high dV/dt (AC) operation.

Note that the etching stopper layer 51 may be conductive. However, in the gate pad region 13, one of the interlayer insulating film 34 and the field insulating film 32 preferably has film thickness sufficiently larger than that of the other and the gate insulating film.

Figure 6:
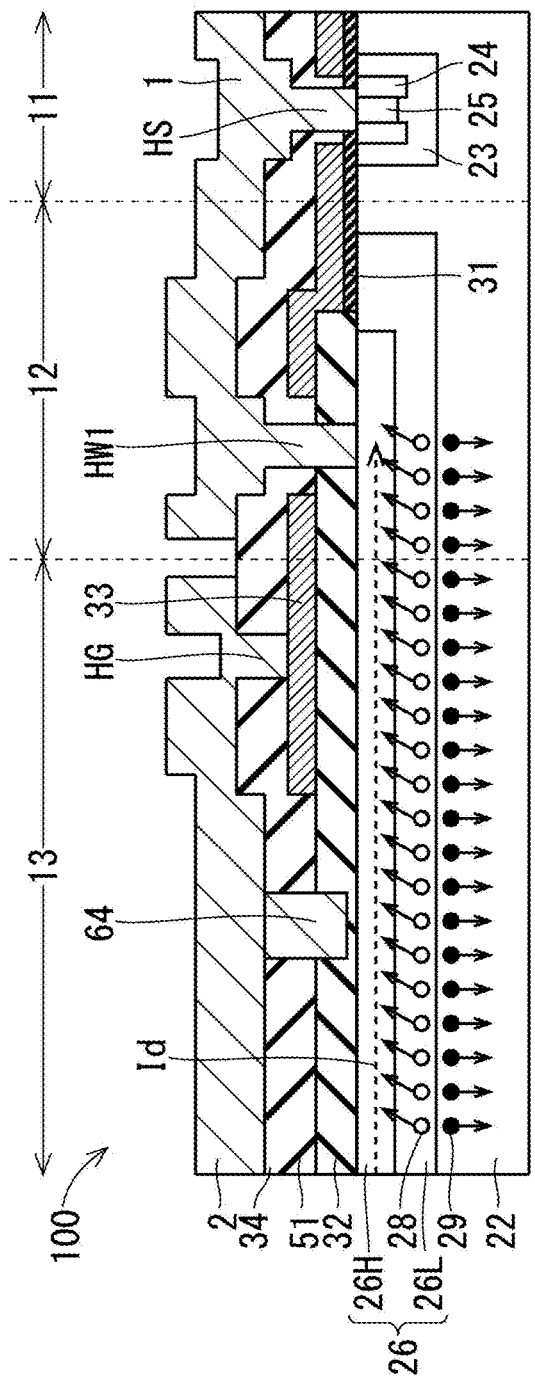
FIG. 6 is a cross-sectional view of a MOSFET of a comparative example.

FIG. 6 illustrates a cross-sectional configuration of a MOSFET 100 without an etching stopper layer as a comparative example. The MOSFET 100 has the same configuration as the MOSFET 101 except that the etching stopper layer 51 is not provided. Under the gate pad region 13 at the time of reverse bias, a hole 28 moves from the p-type well body region 26L to the P+-type well contact region 26H, and an electron 29 moves downward from an interface with the well body region 26L of the n-type drift layer 22. Then, in the well contact region 26H, displacement current Id flows from the gate pad region 13 toward the under-gate well contact region 12, so that a pn junction portion between the second well region 26 and the drift layer 22 is depleted, and the withstand voltage is maintained. However, during high-speed operation (application of high dV/dt) required for a silicon carbide semiconductor device, voltage is applied before the pn junction is completely depleted. For this reason, a high electric field is applied to the field insulating film 32 and the interlayer insulating film 34. FIG. 6 illustrates a state in which a defect occurs on the field insulating film 32 and the interlayer insulating film 34 in a region 64, and the insulating film becomes thin. When the high electric field is applied to such a location, dielectric breakdown occurs.

A-3. Manufacturing Process

FIGS. 7 to 12 are cross-sectional views illustrating a manufacturing process of the MOSFET 101. Hereinafter, the manufacturing process of the MOSFET 101 will be described with reference to FIGS. 7 to 12. First, the n-type drift layer 22 is formed on a SiC substrate 21 by epitaxial growth. For the epitaxial growth, for example, a chemical vapor deposition (CVD) method is used.

Then, the p-type first well region 23 is formed on a surface layer of the drift layer 22 in the device region 11, and the p-type well body region 26L is formed on a surface layer of the drift layer 22 in the under-gate well contact region 12 and the gate pad region 13. Further, the n-type source region 24 and the N+-type well contact region 25 are formed on a surface layer of the first well region 23, and the P+-type well contact region 26H is formed on a surface layer of the well body region 26L.

Figure 7:
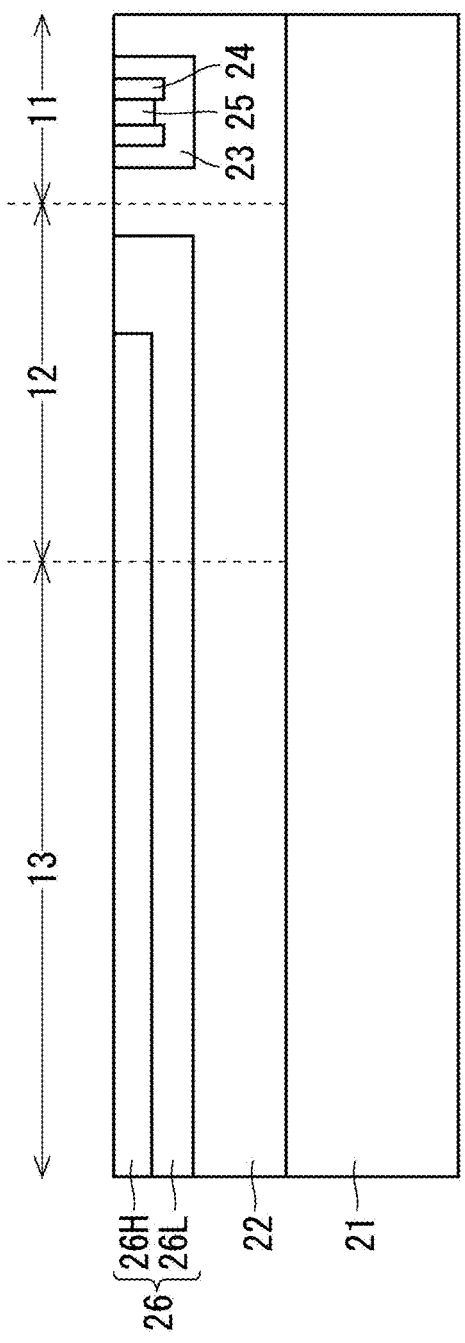
FIGS. 7 to 12 are cross-sectional views each illustrating a manufacturing process of the MOSFET of the first preferred embodiment.

The first well region 23, the source region 24, the well contact region 25, the well body region 26L, and the well contact region 26H are formed by performing selective ion implantation using an implantation mask (not illustrated) a necessary number of times. As the implantation mask, for example, a resist mask or an oxide film mask is used. At the time of ion implantation, the semiconductor substrate does not need to be actively heated, or may be heated to about 200° C. or more and 800° C. or less. As an ion used for ion implantation, aluminum (Al) or boron (B) is suitable for imparting the p-type, and nitrogen (N) or phosphorus (P) is suitable for imparting the n-type. In the above manner, the cross-sectional structure illustrated in FIG. 7 is obtained.

Figure 8:
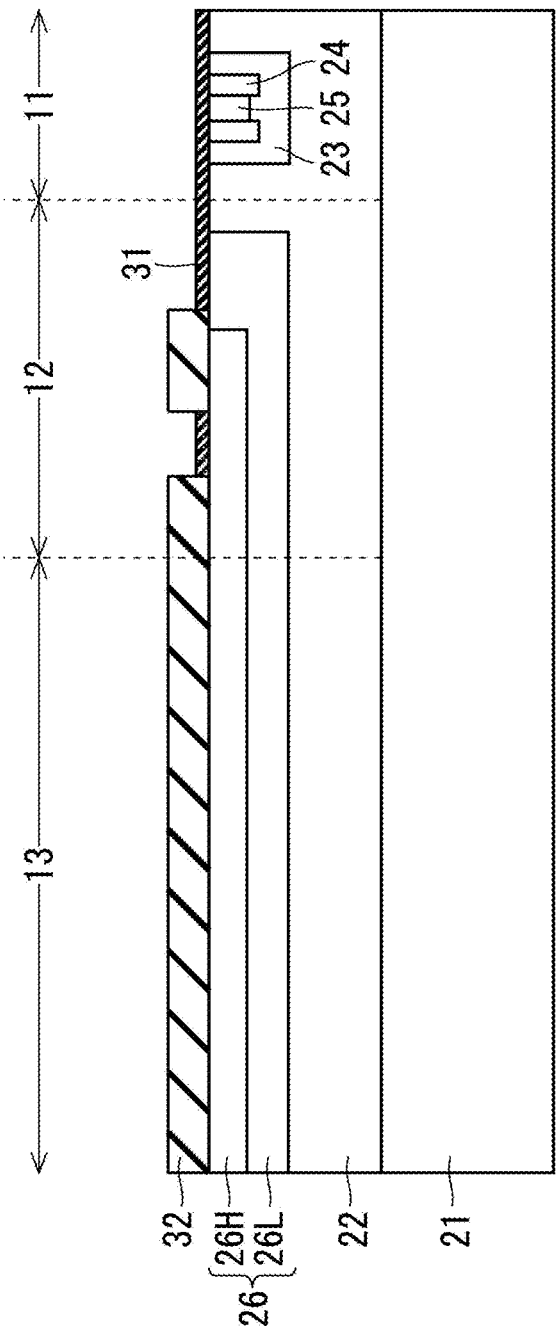

Next, the field insulating film 32 is formed in the under-gate well contact region 12 and the gate pad region 13. The field insulating film 32 is formed on an entire surface of a semiconductor layer, for example, and then patterned so as to remain only in a desired region. After the above, the gate insulating film 31 is formed on an upper surface of a semiconductor layer on which the field insulating film 32 is not formed. In the above manner, the cross-sectional structure illustrated in FIG. 8 is obtained.

Figure 9:
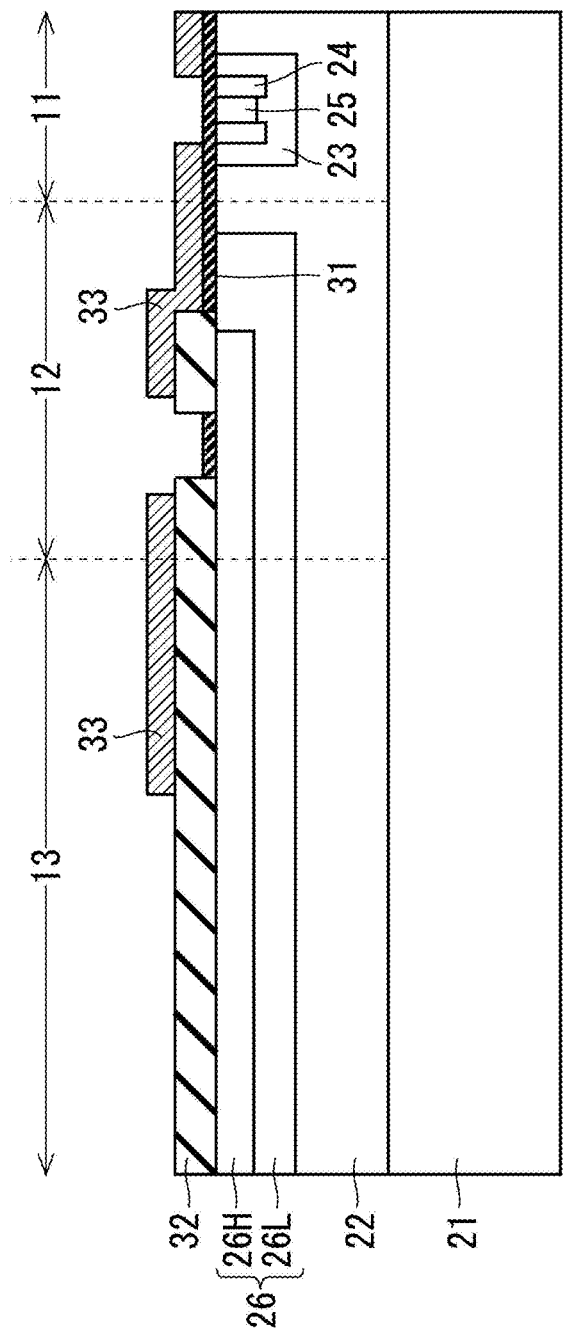

After the above, the gate electrode 33 is formed in the device region 11, the under-gate well contact region 12, and the gate pad region 13, and patterning is performed. In the above manner, the cross-sectional structure illustrated in FIG. 9 is obtained.

Figure 10:
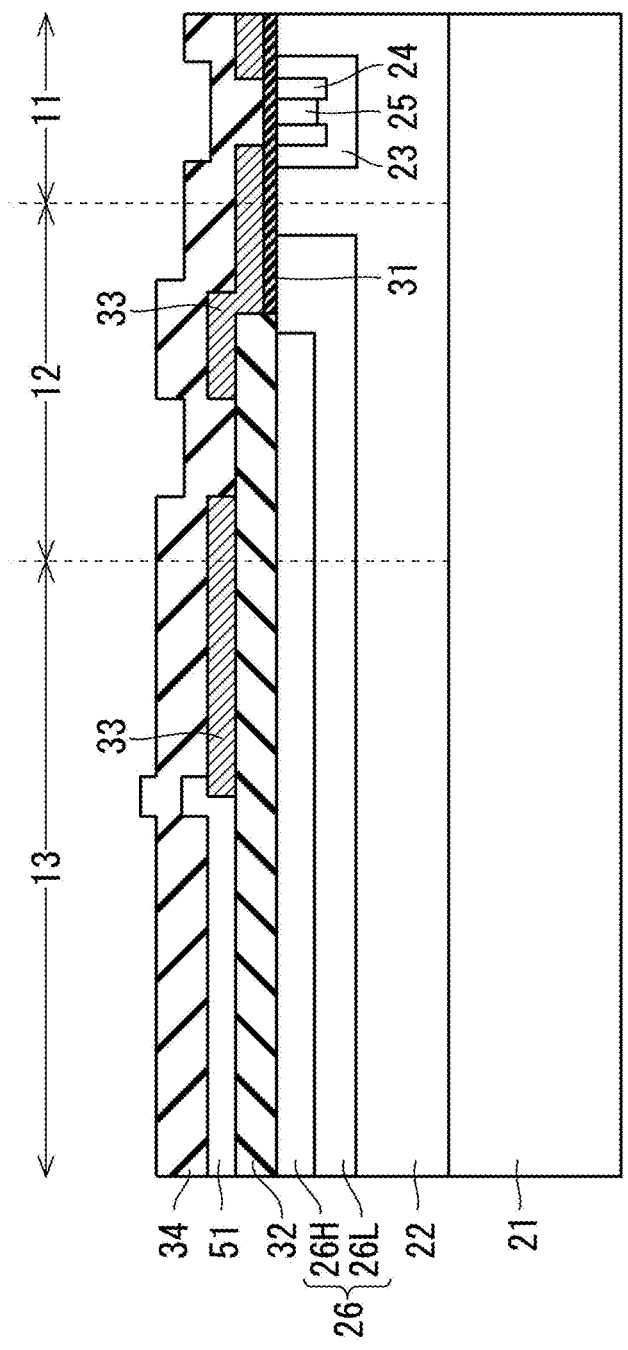

Next, the etching stopper layer 51 is formed in the gate pad region 13, and patterning is performed. The etching stopper layer 51 is formed in contact with an end portion of the gate electrode 33 formed in the gate pad region 13 on the side opposite to the under-gate well contact region 12. Furthermore, the interlayer insulating film 34 is formed in the device region 11, the under-gate well contact region 12, and the gate pad region 13, and patterning is performed. In this manner, the etching stopper layer 51 is sandwiched between the field insulating film 32 and the interlayer insulating film 34 in the gate pad region 13. In the above manner, the cross-sectional structure illustrated in FIG. 10 is obtained.

Figure 11:
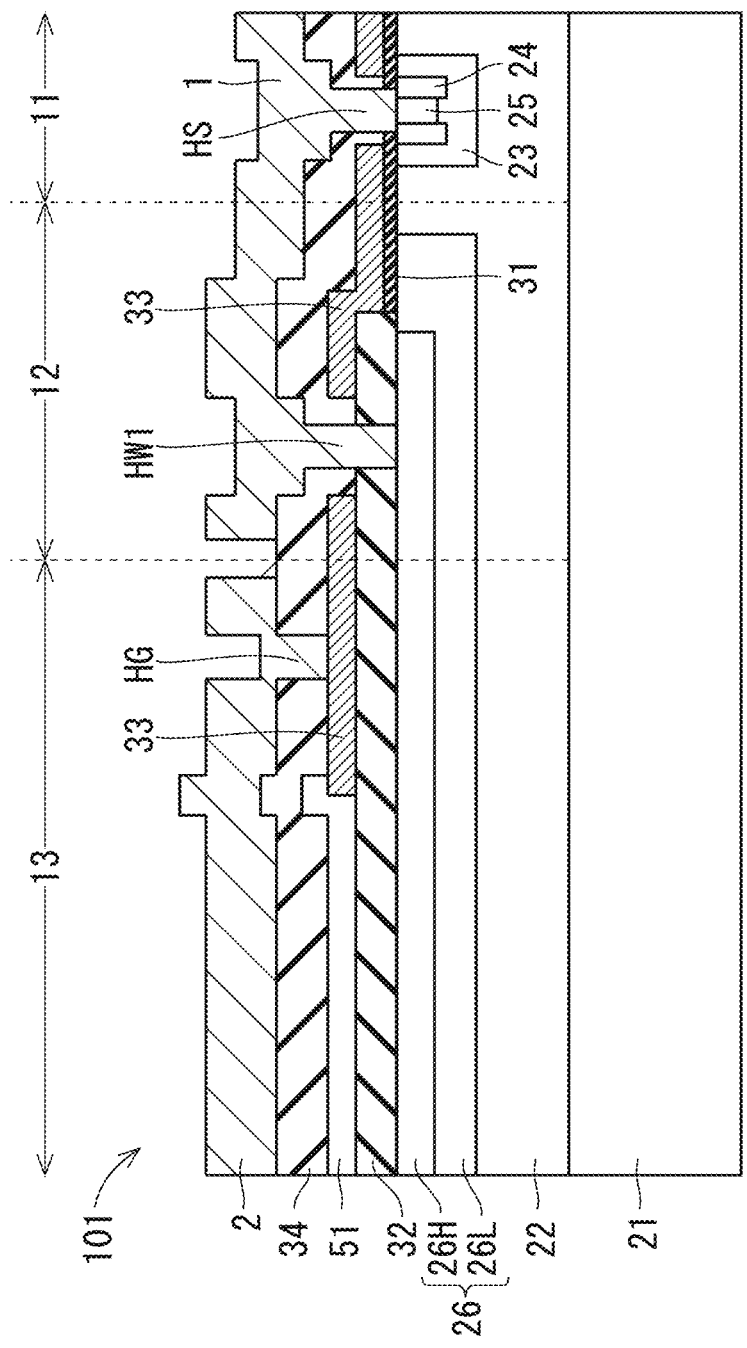

After the above, in the device region 11, the source contact hole HS that penetrates the interlayer insulating film 34 and the gate insulating film 31 and reaches the source region 24 and the well contact region 25 is formed. Further, in the under-gate well contact region 12, the well contact hole HW1 that penetrates the interlayer insulating film 34 and the field insulating film 32 and reaches the well contact region 26H is formed. Further, in the gate pad region 13, the gate contact hole HG penetrating the interlayer insulating film 34 and reaching the gate electrode 33 is formed. After the above, the source electrode 1 is formed as a surface electrode in the device region 11 and the under-gate well contact region 12, and the gate pad 2 is formed in the gate pad region 13. The source electrode 1 is in contact with the source region 24 and the well contact region 25 through the source contact hole HS, and is in contact with the well contact region 26H through the well contact hole HW1. The gate pad 2 is in contact with the gate electrode 33 through the gate contact hole HG. In the above manner, the cross-sectional structure illustrated in FIG. 11 is obtained.

Figure 12:
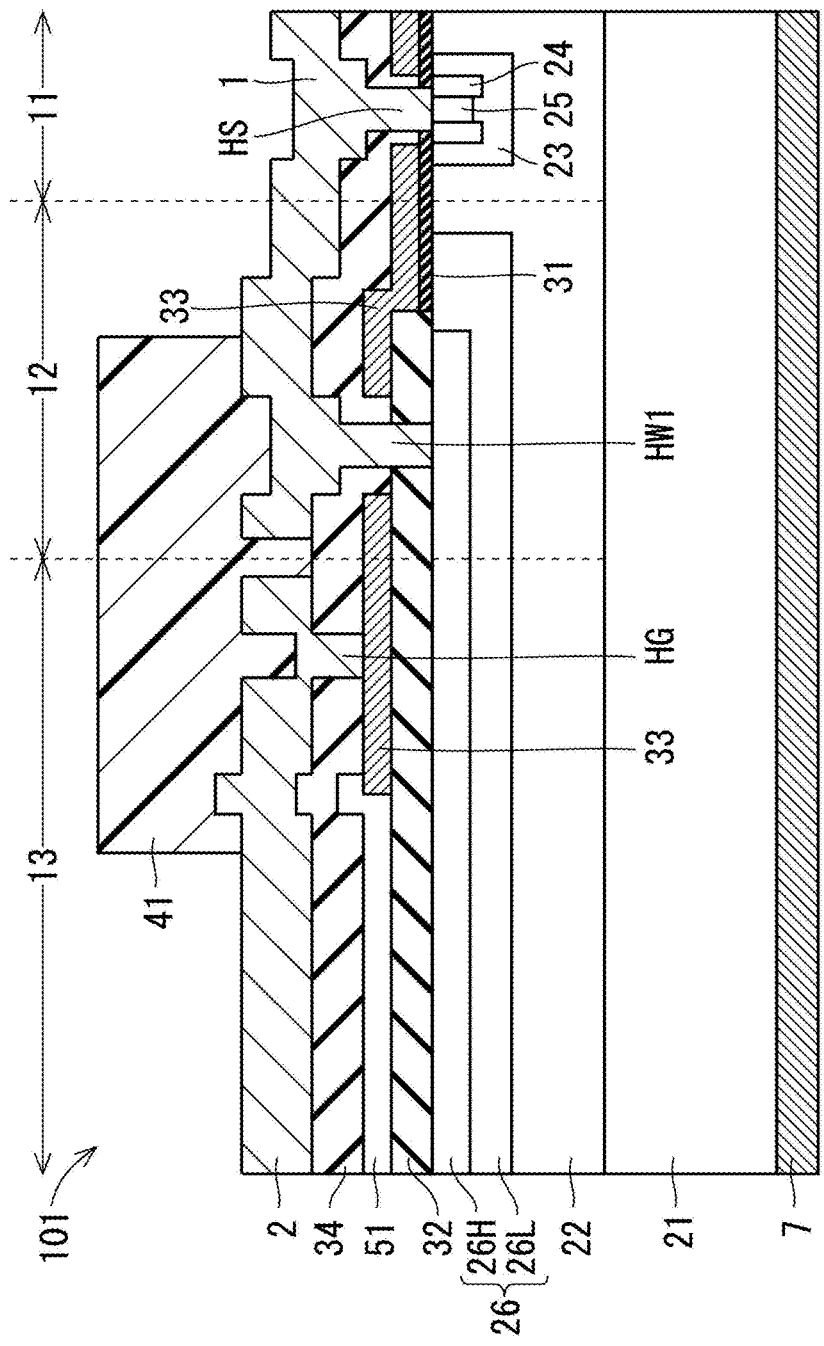

Next, a protective film 41 such as polyimide is formed on a surface electrode. Further, a drain electrode 7 is formed as a back electrode on the back surface side of the SiC substrate 21. In this way, the MOSFET 101 having the cross-sectional structure illustrated in FIG. 12 is completed.

A-4. Variation

Figure 13:
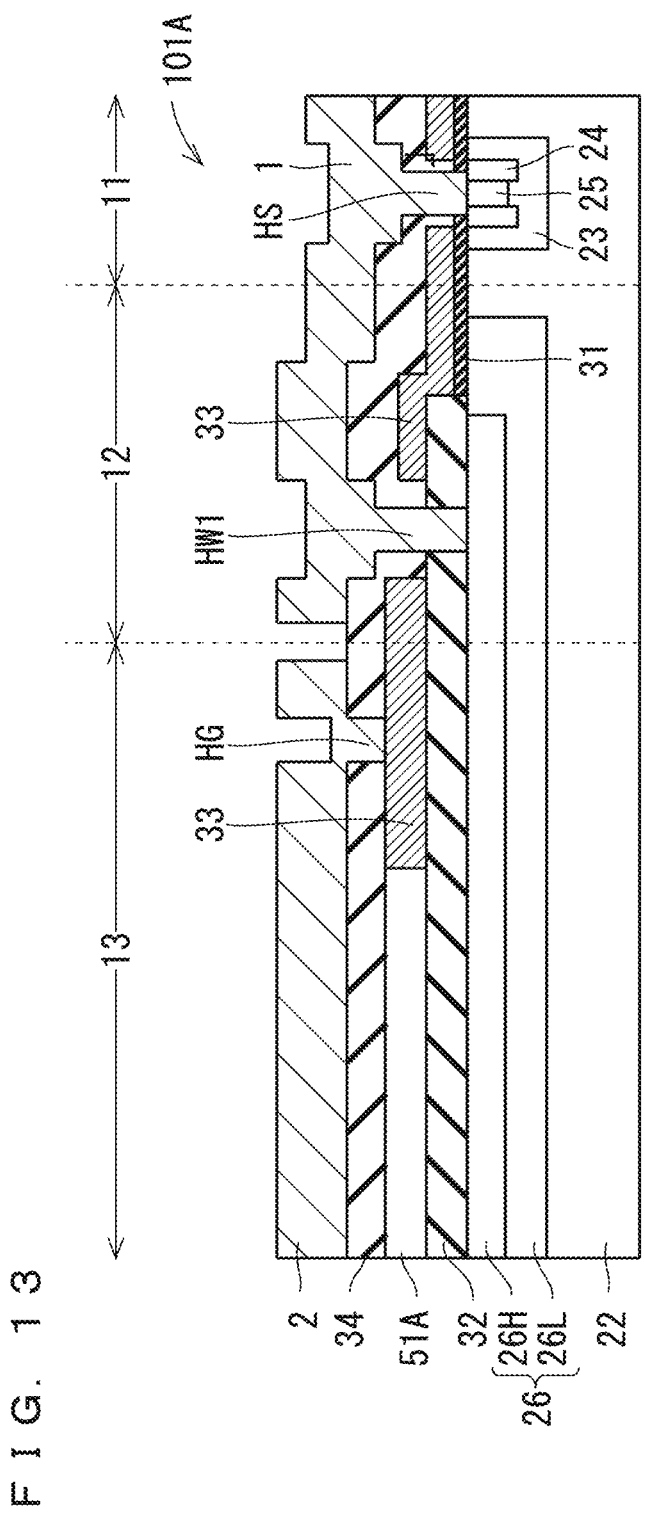
FIG. 13 is a cross-sectional view of the MOSFET of a variation of the first preferred embodiment.

FIG. 13 is a cross-sectional view of a MOSFET 101A according to a variation of the first preferred embodiment. A plan view of the MOSFET 101A is as illustrated in FIG. 1 or 2. FIG. 13 illustrates a cross-sectional configuration taken along line A-A in FIG. 1 or line B-B in FIG. 2.

The MOSFET 101A is different from the MOSFET 101 in that an etching stopper layer 51A is provided instead of the etching stopper layer 51. The etching stopper layer 51A is made from low-resistance polysilicon which is the same material as the gate electrode 33. Therefore, the etching stopper layer 51A can be formed simultaneously with a manufacturing process of the gate electrode 33.

A-5. Effect

The MOSFET 101 of the first preferred embodiment is divided into a plurality of regions including the device region 11 in which a switching element is formed, the gate pad region 13 in which the gate pad 2 is formed, and the under-gate well contact region 12 between the device region 11 and the gate pad region 13 in plan view. The MOSFET 101 includes a semiconductor layer made from silicon carbide. The semiconductor layer includes the n-type drift layer 22 and the second well region 26 formed on a surface layer of the drift layer 22 over the gate pad region 13 and the under-gate well contact region 12. The MOSFET 101 includes the field insulating film 32 formed on an upper surface of the semiconductor layer in the gate pad region 13, the gate electrode 33 and the etching stopper layer 51 formed on the field insulating film 32 in the gate pad region 13, the interlayer insulating film 34 formed on the gate electrode 33 and on the etching stopper layer 51, the source electrode 1 which is a surface electrode formed on the interlayer insulating film 34 in the under-gate well contact region 12 and in contact with the second well region 26 through the well contact hole HW1 penetrating the field insulating film 32 and the interlayer insulating film 34, and the gate pad 2 formed on the interlayer insulating film 34 in the gate pad region 13 and in contact with the gate electrode 33 through the gate contact hole HG penetrating the interlayer insulating film 34. The etching stopper layer 51 is made from a substance having a selectivity of 5.0 or more with respect to etching of the interlayer insulating film 34 and the field insulating film 32, and is provided at a position farthest from the well contact hole HW1 of the under-gate well contact region 12 at least in the gate pad region 13. By the above configuration, even if a defect occurs in at least one of the field insulating film 32 and the interlayer insulating film 34 in a region where a highest electric field is applied, insulating performance can be maintained by the etching stopper layer 51. As a result, dielectric breakdown at the time of application of high dV/dt can be suppressed.

Further, in the MOSFET 101A of the first preferred embodiment, the etching stopper layer 51A is made from the same material as the gate electrode 33. Therefore, the etching stopper layer 51A can be formed simultaneously with the gate electrode 33.

A method for manufacturing a silicon carbide semiconductor device of the first preferred embodiment, the method including forming the drift layer 22 made from n-type silicon carbide, forming the second well region 26 on a surface layer of the drift layer 22 over the gate pad region 13 and the under-gate well contact region 12, forming the field insulating film 32 on the drift layer 22 and the second well region 26 in the gate pad region 13, forming the gate electrode 33 and the etching stopper layer 51 on the field insulating film 32 in the gate pad region 13, forming the interlayer insulating film 34 on the gate electrode 33 and the etching stopper layer 51, forming the source electrode 1 which is a surface electrode on the interlayer insulating film 34 in the under-gate well contact region 12, the source electrode 1 being in contact with the second well region 26 through the well contact hole HW1 penetrating the field insulating film 32 and the interlayer insulating film 34, and forming the gate pad 2 on the interlayer insulating film 34 in the gate pad region 13, the gate pad 2 being in contact with the gate electrode 33 through the gate contact hole HG penetrating the interlayer insulating film 34. The etching stopper layer 51 is made from a substance having a selectivity of 5.0 or more with respect to etching of the interlayer insulating film 34 and the field insulating film 32, and is formed at a position farthest from the well contact hole HW1 in the under-gate well contact region 12 at least in the gate pad region 13. Therefore, according to the method for manufacturing a silicon carbide semiconductor device of the first preferred embodiment, even if a defect is generated in at least one of the field insulating film 32 and the interlayer insulating film 34 in a region of the silicon carbide semiconductor device where a highest electric field is applied, insulating performance can be maintained by the etching stopper layer 51. As a result, dielectric breakdown at the time of application of high dV/dt can be suppressed.

B. Second Preferred Embodiment

B-1. Configuration

Figure 14:
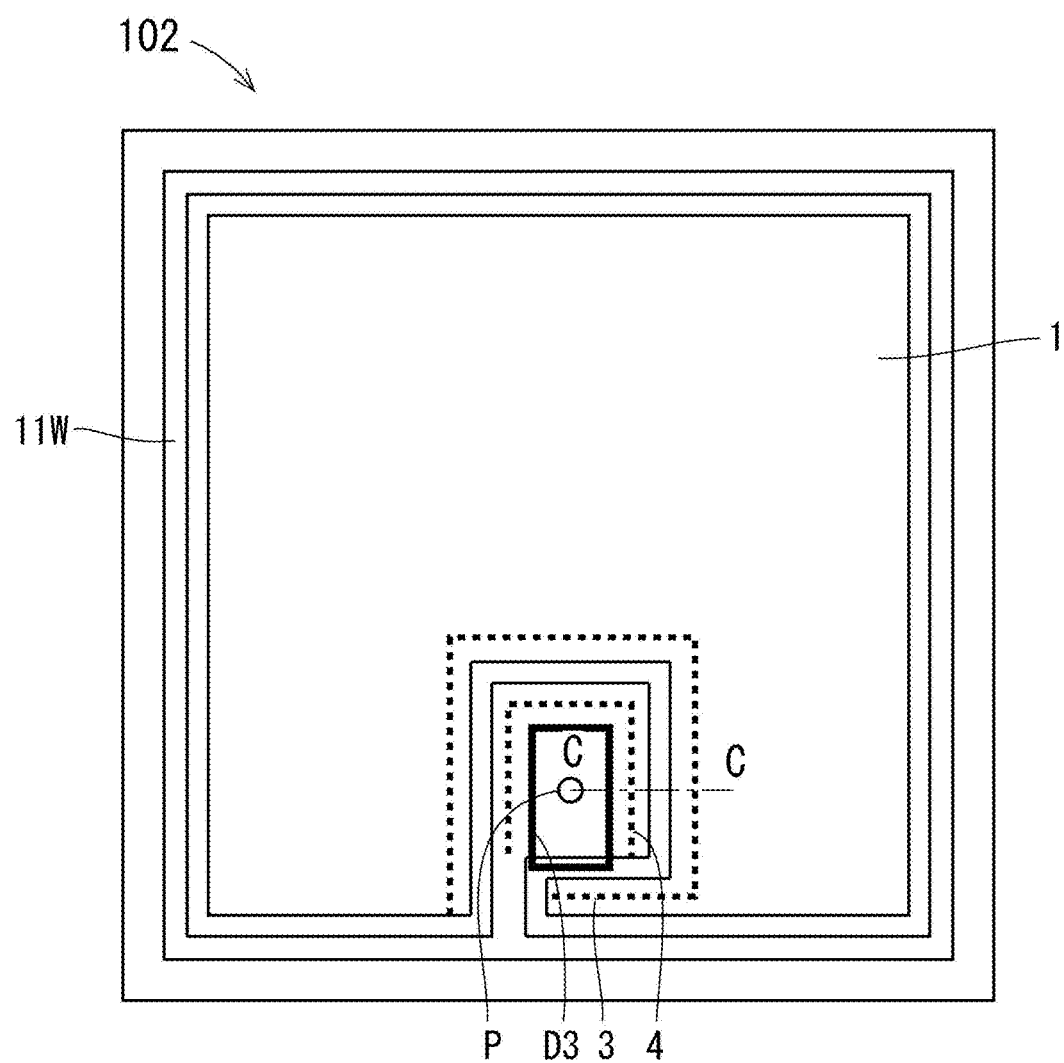
FIG. 14 is a plan view of a first pattern of the MOSFET of a second preferred embodiment.
Figure 15:
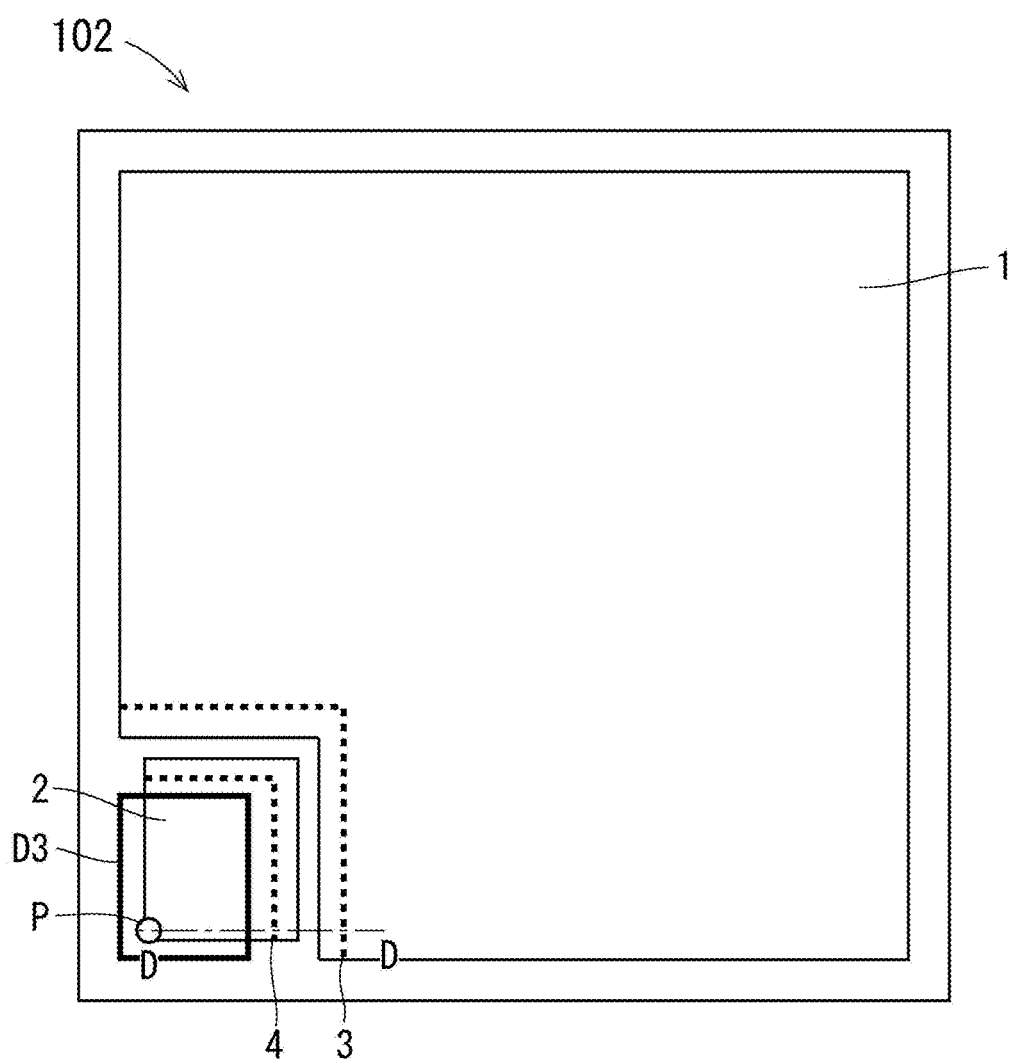
FIG. 15 is a plan view of a second pattern of the MOSFET of the second preferred embodiment.
Figure 16:
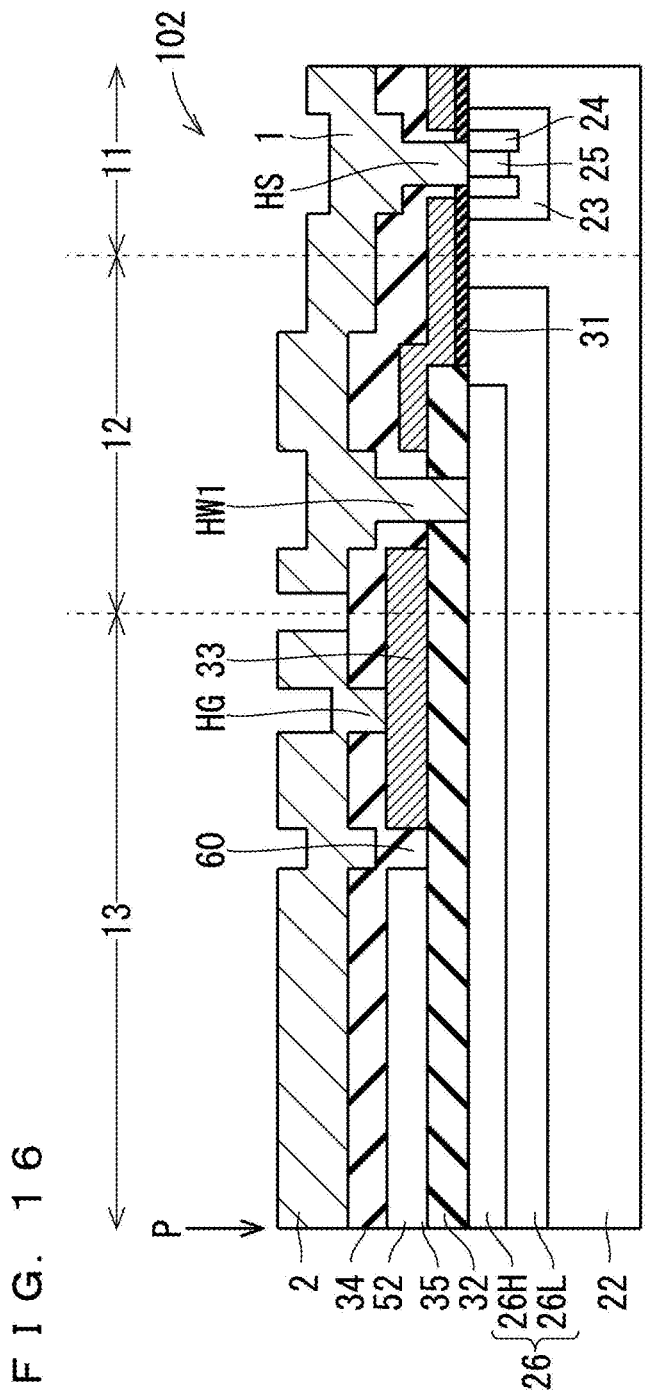
FIG. 16 is a cross-sectional view of the MOSFET of the second preferred embodiment.

FIG. 14 is a plan view of a first pattern of a MOSFET 102 that is a silicon carbide semiconductor device according to a second preferred embodiment. FIG. 15 is a plan view of a second pattern of the MOSFET 102. FIG. 16 is a cross-sectional view of the MOSFET 102 taken along line C-C in FIG. 14 or line D-D in FIG. 15. In FIGS. 14 and 15, the broken line 3 indicates the position of the well contact hole HW1, and the broken line 4 indicates the position of the gate contact hole HG. Further, a point P indicates a point in the gate pad region 13 farthest from an under-gate well contact region 12, in other words, the well contact hole HW1.

As illustrated in FIG. 16, the MOSFET 102 is different from the MOSFET 101 in that an etching stopper layer 52 is provided instead of the etching stopper layer 51. The etching stopper layer 52 is made from low-resistance polysilicon similarly to the etching stopper layer 51A of the first variation of the first preferred embodiment. However, the etching stopper layer 52 is separated from the gate electrode 33 by the interlayer insulating film 34. The interlayer insulating film 34 existing between the etching stopper layer 52 and the gate electrode 33 is also referred to as a separation region 60.

The gate contact hole HG is provided along at least a part of the outer periphery of the gate pad 2 in the gate pad region 13. The well contact hole HW1 is provided along the outer periphery of the gate pad 2 in the under-gate well contact region 12. The under-gate well contact region 12 is provided at least in a region of the under-gate well contact region 12 facing the gate contact hole HG. The separation region 60 between the etching stopper layer 52 and the gate electrode 33 is arranged in the vicinity of the gate contact hole HG. In FIGS. 14 and 15, a solid line D3 indicates the position of the separation region 60. By providing the separation region 60 between the etching stopper layer 52 and the gate electrode 33, dielectric breakdown can be suppressed even if the interlayer insulating film 34 has a defect.

The etching stopper layer 52 is preferably non-conductive. However, even if the etching stopper layer 52 is conductive, dielectric breakdown can be suppressed by making one of the interlayer insulating film 34 and the field insulating film 32 sufficiently larger in film thickness than the other or the gate insulating film under the gate pad region 13.

In the example of FIG. 14, the gate contact hole HG is provided along three of four sides of the rectangular gate pad region 13. Further, in the example of FIG. 15, the gate contact hole HG is provided along two of four sides of rectangular gate pad region 13. As illustrated in FIGS. 4 and 5, potential generated in the gate pad region 13 when high dV/dt is applied is lower at a position closer to the under-gate well contact region 12. In view of the above, the gate contact hole HG is arranged in the vicinity of the outer periphery of the gate pad 2, the well contact hole HW1 is arranged in the vicinity of the gate contact hole HG, and the separation region 60 between the etching stopper layer 52 and the gate electrode 33 is arranged in the vicinity of the gate contact hole HG. In this manner, even if a defect occurs in at least one of the field insulating film 32 and the interlayer insulating film 34 in the separation region 60, potential generated when high dV/dt is applied is small in the separation region 60. For this reason, dielectric breakdown when high dV/dt is applied can be suppressed. In order to prevent dielectric breakdown in the separation region 60 even if a defect occurs in at least one of the field insulating film 32 and the interlayer insulating film 34, the width of the separation region 60 is desirably equal to or more than thickness of the interlayer insulating film 34.

The separation region 60 does not need to be arranged in the gate pad region 13 on a side where the gate contact hole HG is not arranged among edge sides of the gate pad region 13, and is desirably arranged so as to overlap a boundary between the gate pad region 13 and the under-gate well contact region 12, for example. In this manner, even if a defect occurs in at least one of the field insulating film 32 and the interlayer insulating film 34, it is possible to suppress dielectric breakdown between surface electrodes, that is, between the source electrode 1 and the gate pad 2.

B-2. Variation

Figure 17:
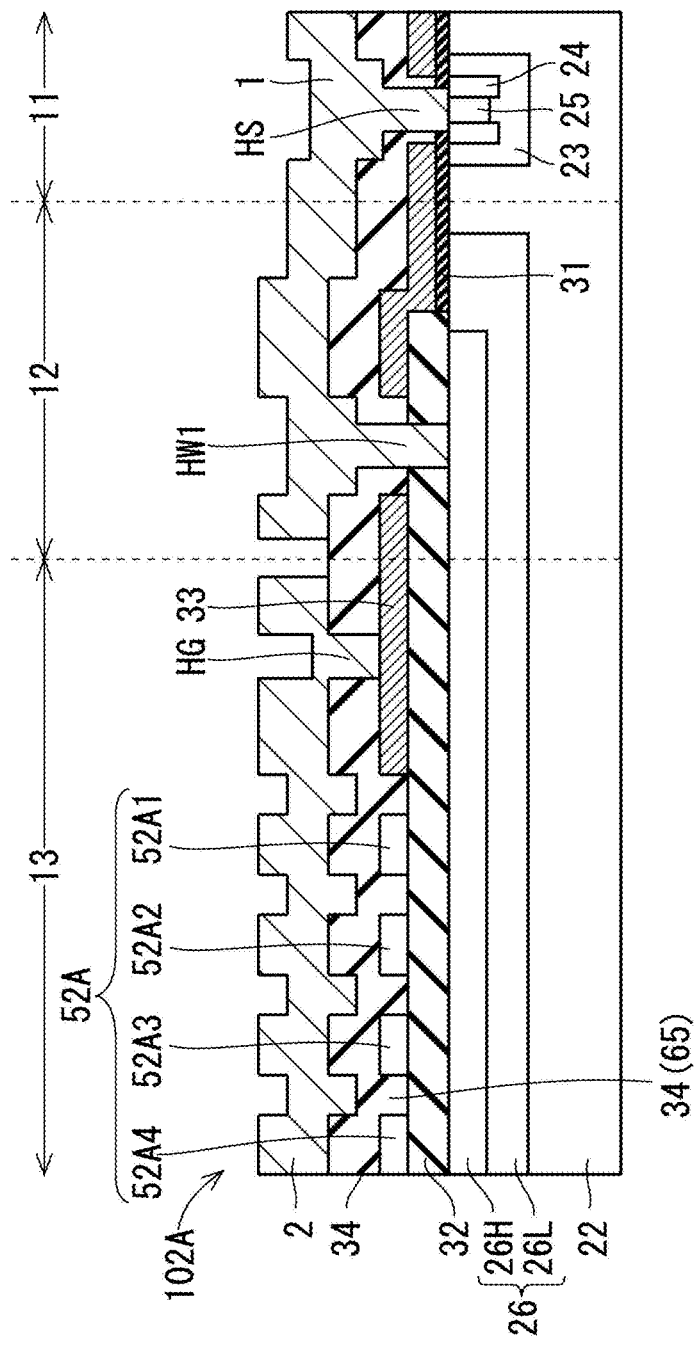
FIG. 17 is a cross-sectional view of the MOSFET of a variation of the second preferred embodiment.

FIG. 17 is a cross-sectional view of a MOSFET 102A according to a variation of the second preferred embodiment. A plan view of the MOSFET 102A is as illustrated in FIG. 14 or 15. FIG. 17 illustrates a cross-sectional configuration taken along line C-C in FIG. 14 or line D-D in FIG. 15.

The MOSFET 102A is different from the MOSFET 102 in that an etching stopper layer 52A is provided instead of the etching stopper layer 52. The etching stopper layer 52A is different from the etching stopper layer 52 in that the etching stopper layer 52A is divided into a plurality of regions 52A1, 52A2, 52A3, and 52A4 by the interlayer insulating film 34. In other words, the etching stopper layer 52A is divided into a plurality of the regions 52A1, 52A2, 52A3, and 52A4 by a dividing region 65 composed of the interlayer insulating film 34.

An advantage that the etching stopper layer 52A is divided into a plurality of the regions 52A1, 52A2, 52A3, and 52A4 will be described below.

Figure 18:
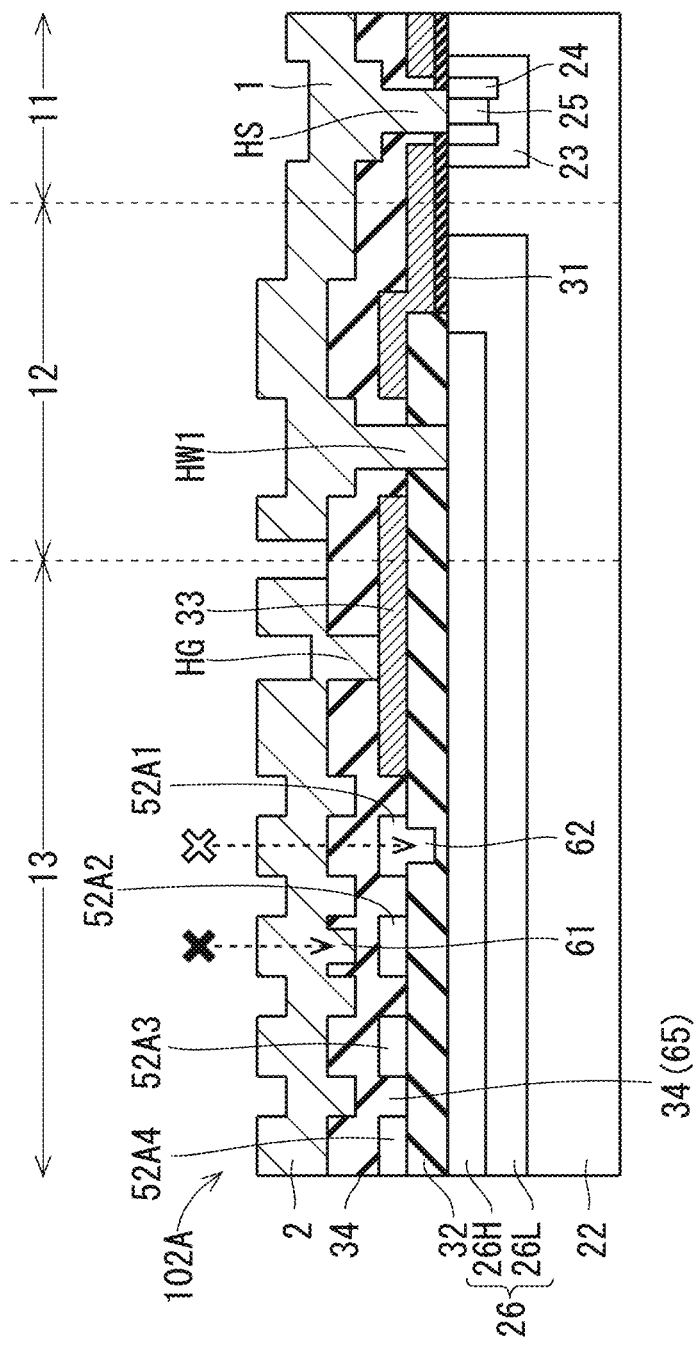
FIG. 18 is a cross-sectional view illustrating a state in which a defect occurs in each of an interlayer insulating film and a field insulating film in the MOSFET in the variation of the second preferred embodiment.
Figure 20:
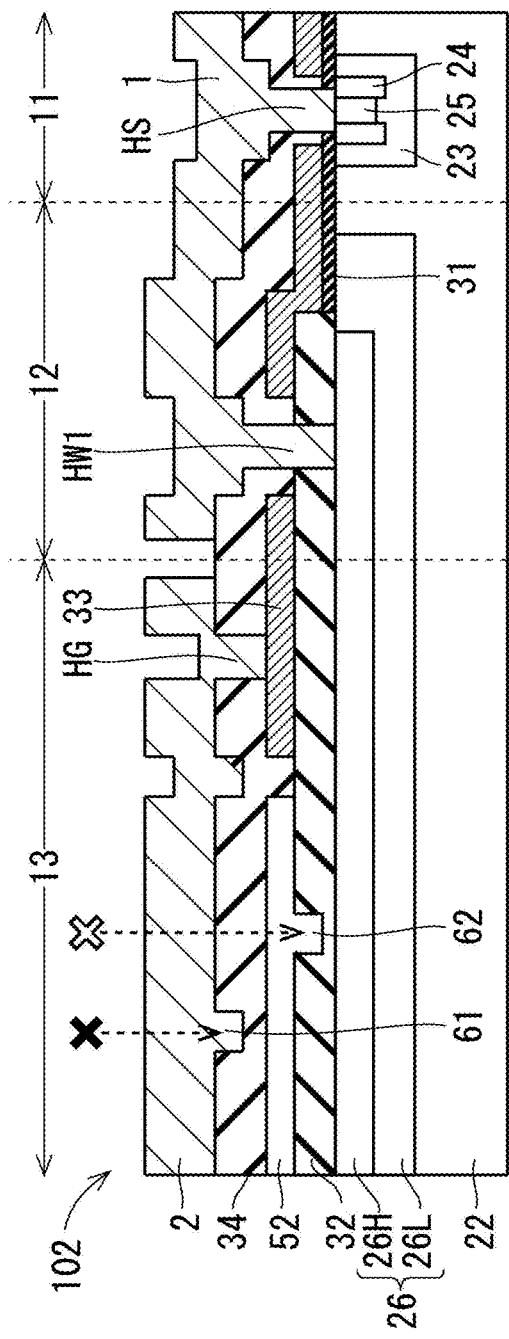
FIG. 20 is a cross-sectional view illustrating a state in which a defect occurs in each of the interlayer insulating film and the field insulating film in the MOSFET of the second preferred embodiment.

FIG. 18 is a cross-sectional view of the MOSFET 102A illustrating a state in which defects 61 and 62 are generated on the interlayer insulating film 34 and the field insulating film 32, respectively. FIG. 19 is a plan view illustrating the etching stopper layer 52A and the interlayer insulating film 34 of the MOSFET 102A illustrated in FIG. 18. FIG. 20 is a cross-sectional view of the MOSFET 102 illustrating a state in which defects 61 and 62 are generated on the interlayer insulating film 34 and the field insulating film 32, respectively. FIG. 21 is a plan view illustrating the etching stopper layer 52 and the interlayer insulating film 34 of the MOSFET 102 illustrated in FIG. 20. As illustrated in FIGS. 20 and 21, when the defects 61 and 62 are generated simultaneously in the interlayer insulating film 34 and the field insulating film 32, dielectric breakdown may occur in the defects 61 and 62 when high dV/dt is applied in the MOSFET 102.

In contrast, in the MOSFET 102A, as illustrated in FIGS. 18 and 19, the region 52A2 of the etching stopper layer 52A immediately below the defect 61 and the region 52A1 of the etching stopper layer 52A immediately above the defect 62 are divided by the interlayer insulating film 34. Therefore, the dielectric breakdown caused by the defects 61 and 62 when high dV/dt is applied is suppressed. As described above, in the MOSFET 102A, dielectric breakdown when high dV/dt is applied is suppressed as long as the defect is generated simultaneously in regions of the field insulating film 32 and the interlayer insulating film 34 corresponding to the same region of the etching stopper layer 52A.

B-3. Effect

In the MOSFET 102 of the second preferred embodiment, the etching stopper layer 52 is separated from the gate electrode 33 by the interlayer insulating film 34. Therefore, even if the interlayer insulating film 34 has a defect, dielectric breakdown can be suppressed.

In the MOSFET 102A of the second preferred embodiment, the etching stopper layer 52A is divided into a plurality of the regions 52A1, 52A2, 52A3, and 52A4 by an insulating film. Therefore, in the MOSFET 102A, dielectric breakdown when high dV/dt is applied is suppressed as long as the defect is generated simultaneously in regions of the field insulating film 32 and the interlayer insulating film 34 corresponding to the same region of the etching stopper layer 52A.

C. Third Preferred Embodiment

C-1. Configuration

Figure 22:
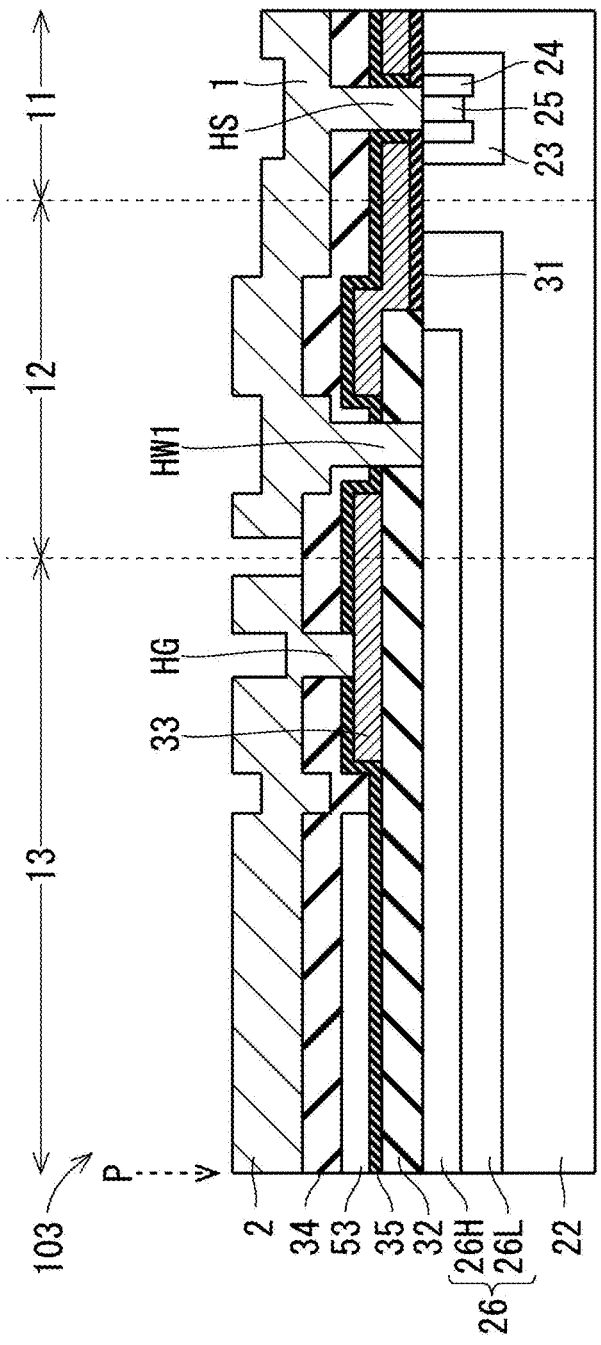
FIG. 22 is a cross-sectional view illustrating a device region, an under-gate well contact region, and a gate pad region of the MOSFET of a third preferred embodiment.
Figures 23A, 23B:
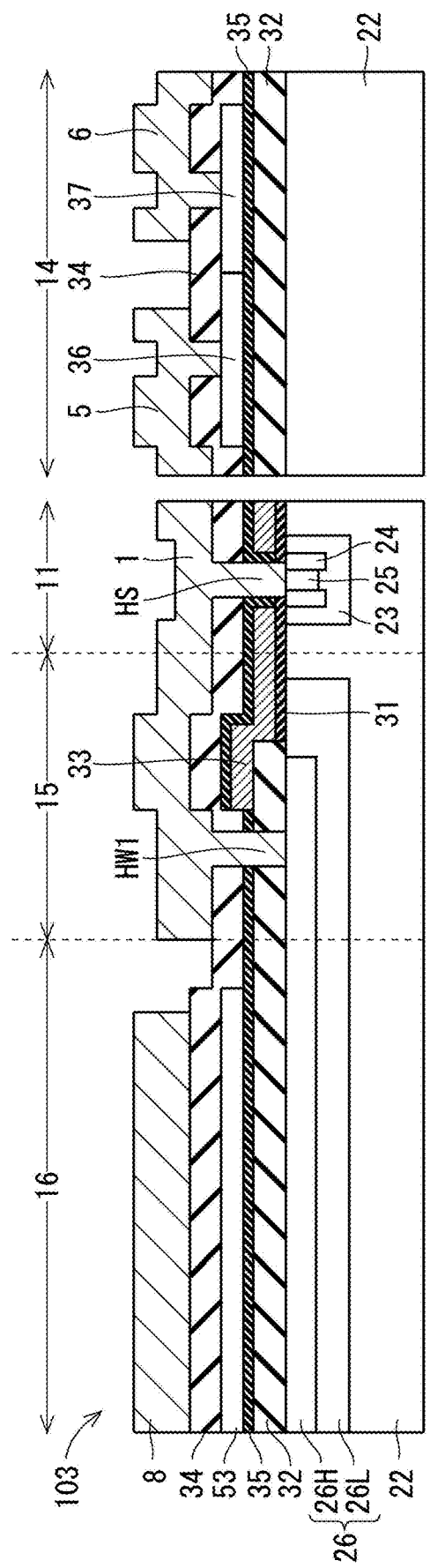
FIGS. 23A and 23B are cross-sectional views each illustrating the device region, a temperature sense pad well contact region, a temperature sense pad region, and a temperature sense diode region of the MOSFET of the third preferred embodiment.

A MOSFET 103 which is the silicon carbide semiconductor device of a third preferred embodiment includes a temperature sense diode region 14, a temperature sense pad well contact region 15, and a temperature sense pad region 16 in addition to the device region 11, the under-gate well contact region 12, and the gate pad region 13. FIG. 22 is a cross-sectional view illustrating the device region 11, the under-gate well contact region 12, and the gate pad region 13 of the MOSFET 103. FIG. 23A is a cross-sectional view illustrating the device region 11, the temperature sense pad well contact region 15, and the temperature sense pad region 16 of the MOSFET 103. FIG. 23B is a cross-sectional view illustrating the temperature sense diode region 14 of the MOSFET 103.

As illustrated in FIG. 22, in the gate pad region 13 of the MOSFET 103, an etching stopper layer 53 is provided between the field insulating film 32 and the interlayer insulating film 34 at a position including the point P farthest from the well contact hole HW1. The etching stopper layer 53 is, for example, p-type polysilicon. Further, a separation insulating film 35 is provided on the field insulating film 32 and the gate electrode 33. The other configurations in the device region 11, the under-gate well contact region 12, and the gate pad region 13 of the MOSFET 103 are similar to those of the MOSFETs 101 and 102 of the first preferred embodiment or the second preferred embodiment.

As illustrated in FIG. 23A, the temperature sense pad well contact region 15 has the same configuration as the under-gate well contact region 12 in the MOSFET 103. Further, the temperature sense pad region 16 has the same configuration as the gate pad region 13 in the MOSFET 103 except that a temperature sense pad 8 is provided instead of the gate pad 2 and the gate contact hole HG and the gate electrode 33 are not provided. That is, the etching stopper layer 53 is provided between the field insulating film 32 and the interlayer insulating film 34 also in the temperature sense pad region 16. The temperature sense pad 8 is electrically connected to a temperature sense diode of the temperature sense diode region 14.

As illustrated in FIG. 23B, the temperature sense diode region 14 includes the drift layer 22, the field insulating film 32, the separation insulating film 35, an n-type region 36, a p-type region 37, the interlayer insulating film 34, an anode electrode 5, and a cathode electrode 6. The field insulating film 32 is provided on the drift layer 22. The separation insulating film 35 is provided on the field insulating film 32. The n-type region 36 and the p-type region 37 are provided adjacent to each other on the separation insulating film 35. The n-type region 36 and the p-type region 37 are made from polysilicon. The interlayer insulating film 34 is provided on the separation insulating film 35, the n-type region 36, and the p-type region 37. The interlayer insulating film 34 is provided with the anode electrode 5 and the cathode electrode 6. The anode electrode 5 and the cathode electrode 6 are in contact with the n-type region 36 and the p-type region 37, respectively, through a contact hole of the interlayer insulating film 34. In the temperature sense diode region 14, a lateral pn diode is configured as a temperature sense diode by the n-type region 36 and the p-type region 37.

In the above description, the etching stopper layer 53 is n-type polysilicon, but may be p-type polysilicon.

C-2. Manufacturing Process

Figures 24A, 24B:
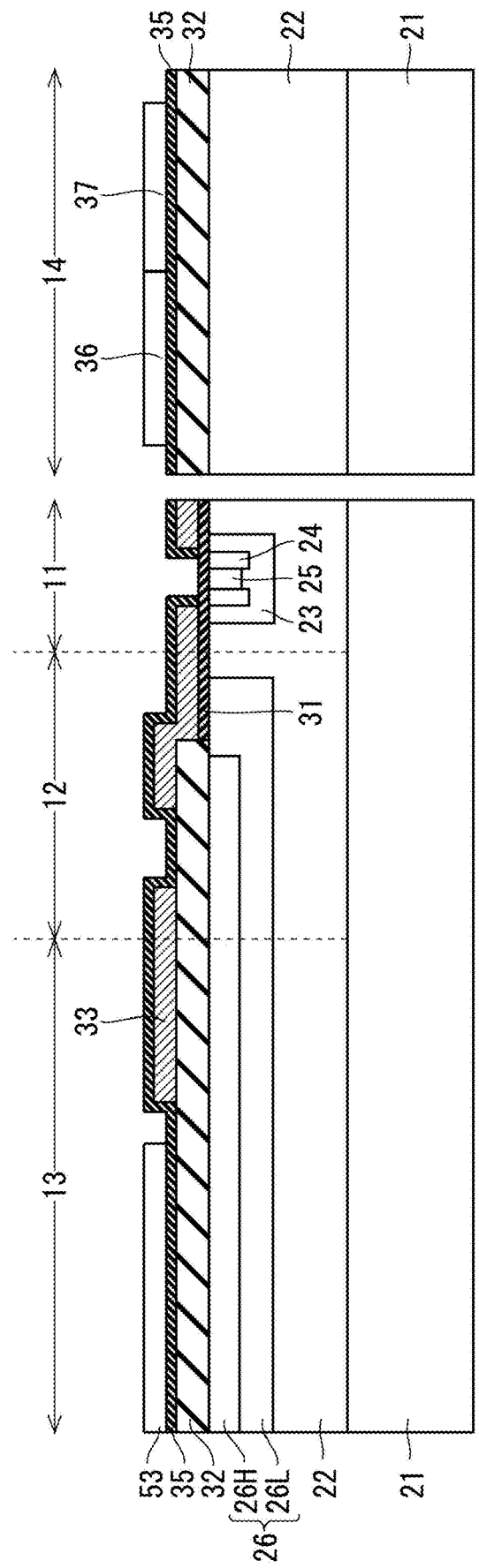

FIGS. 24A to 26B are cross-sectional views illustrating a manufacturing process of the device region 11, the under-gate well contact region 12, the gate pad region 13, and the temperature sense diode region 14 of the MOSFET 103 of the third preferred embodiment. FIGS. 24A, 25A, and 26A illustrate a manufacturing process of the device region 11, the under-gate well contact region 12, and the gate pad region 13, and FIGS. 24B, 25B, and 26B illustrate the process of the temperature sense diode region 14. Hereinafter, the manufacturing process of the device region 11, the under-gate well contact region 12, the gate pad region 13, and the temperature sense diode region 14 of the MOSFET 103 will be described.

First, the drift layer 22 is formed on the SiC substrate 21 by epitaxial growth. Next, the first well region 23, the source region 24, and the well contact region 25 are formed in the device region 11, and the second well region 26 is formed in the under-gate well contact region 12 and the gate pad region 13. After the above, the field insulating film 32 is formed in the gate pad region 13, a part of the under-gate well contact region 12, and the temperature sense diode region 14. Further, the gate insulating film 31 is formed in a region of the under-gate well contact region 12 where the field insulating film 32 is not formed and the device region 11. After the above, a gate electrode is formed in the device region 11, the under-gate well contact region 12, and the gate pad region 13.

Next, a separation insulating film 35 for insulating the gate electrode and the temperature sense diode is formed in the device region 11, the under-gate well contact region 12, the gate pad region 13, and the temperature sense diode region 14. The separation insulating film 35 is, for example, TEOS.

After the above, the n-type region 36 and the p-type region 37 are formed on the separation insulating film 35 in the temperature sense diode region 14, and the etching stopper layer 53 is formed in the gate pad region 13. Specifically, n-type polysilicon is formed on the entire surface of the gate pad region 13 and the temperature sense diode region 14. In this manner, n-type polysilicon deposited in the gate pad region 13 becomes the etching stopper layer 53. Next, p-type impurities are selectively implanted into n-type polysilicon deposited in the temperature sense diode region 14 using a mask or the like, and the implanted region is inverted to the p-type. Polysilicon inverted to the p-type becomes the p-type region 37, and a region into which the p-type impurity is not implanted becomes the n-type region 36. In the above manner, the cross-sectional structure illustrated in FIGS. 24A and 24B is obtained.

Figures 25A, 25B:
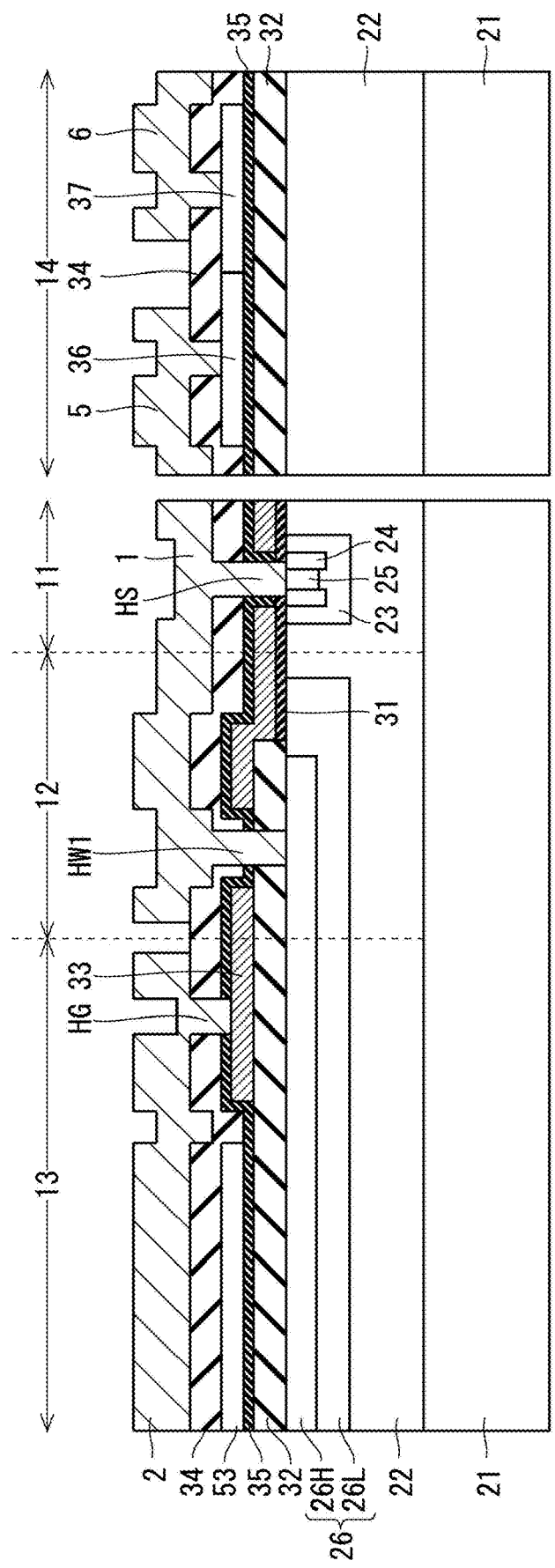

Next, the interlayer insulating film 34 is formed and patterned in the device region 11, the under-gate well contact region 12, the gate pad region 13, and the temperature sense diode region 14. Further, the source contact hole HS, the well contact hole HW1, and the gate contact hole HG are formed. Then, as surface electrodes, the source electrode 1 is formed in the device region 11 and the under-gate well contact region 12, the gate pad 2 is formed in the gate pad region 13, and the anode electrode 5 and the cathode electrode 6 are formed in the temperature sense diode region 14. In the above manner, the cross-sectional structure illustrated in FIGS. 25A and 25B is obtained.

Next, a protective film 41 such as polyimide is formed on a surface electrode. Further, a drain electrode 7 is formed as a back electrode on the back surface side of the SiC substrate 21. In this way, the MOSFET 103 having the cross-sectional structure illustrated in FIGS. 26A and 26B is completed.

C-3. Variation

Figure 27:
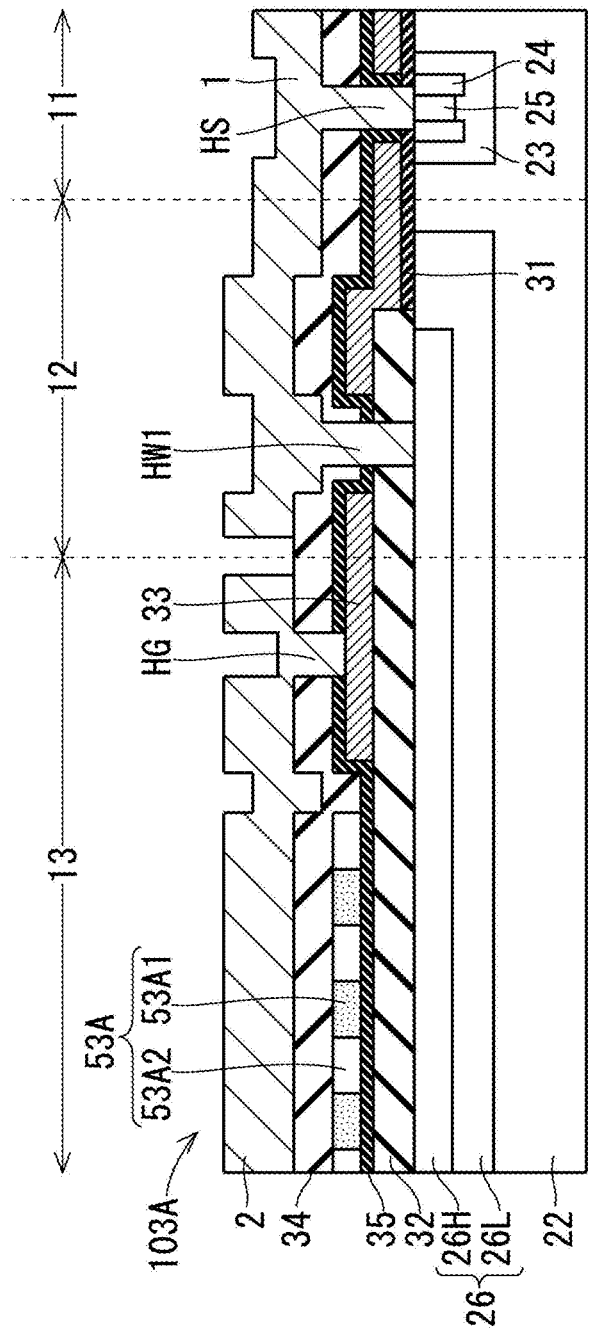
FIG. 27 is a cross-sectional view of the MOSFET of a variation of the third preferred embodiment.

FIG. 27 is a cross-sectional view of the device region 11, the under-gate well contact region 12, and the gate pad region 13 of a MOSFET 103A according to a variation of the third preferred embodiment. The temperature sense diode region 14, the temperature sense pad well contact region 15, and the temperature sense pad region 16 of the MOSFET 103A are similar to those of the MOSFET 103. Alternatively, in the temperature sense pad region 16 of the MOSFET 103A, an etching stopper layer 53A to be described later may be provided instead of the etching stopper layer 53.

As compared with the MOSFET 103, the MOSFET 103A includes the etching stopper layer 53A instead of the etching stopper layer 53 in the gate pad region 13. The etching stopper layer 53A includes a plurality of p-type regions 53A1 and a plurality of n-type regions 53A2, and is provided between the field insulating film 32 and the interlayer insulating film 34 in the gate pad region 13 similarly to the etching stopper layer 53. A plurality of the p-type regions 53A1 and a plurality of the n-type regions 53A2 are alternately arranged adjacent to each other. The p-type region 53A1 is made from polysilicon doped in the p-type, and the n-type region 53A2 is made from polysilicon doped in the n-type.

FIGS. 28 and 29 are plan views illustrating arrangement of the p-type region 53A1 and the n-type region 53A2 of the etching stopper layer 53A in the MOSFET 103A. FIG. 28 illustrates an example in which the p-type region 53A1 and the n-type region 53A2 having a substantially rectangular shape are arranged in a checkered pattern, and FIG. 29 illustrates an example in which the p-type region 53A1 and the n-type region 53A2 having a substantially triangular shape are arranged in a scale pattern. In this way, in a case where a plurality of the p-type regions 53A1 and a plurality of n-type regions 53A2 are alternately arranged without a gap, each of the p-type regions 53A1 or each of the n-type regions 53A2 is in contact with the other p-type regions 53A1 and the other n-type regions 53A2 at corner portions of them. Here, in order to avoid contact between the p-type regions 53A1 or between the n-type regions 53A2, a dividing region 66 composed of the interlayer insulating film 34 is provided at a corner portion of each of the p-type regions 53A1 or each of the n-type regions 53A2. This makes it possible to avoid conduction of the same conductivity-type regions while arranging the p-type region 53A1 and the n-type region 53A2 without a gap. Therefore, the p-type region 53A1 and the n-type region 53A2 are not strictly rectangular or triangular, but are substantially rectangular or substantially triangular in which a corner portion of a rectangle or a triangle is removed according to the dividing region 66.

The etching stopper layer 53A constitutes a plurality of pn diodes. Then, in a region where the etching stopper layer 53A is provided in the gate pad region 13, as the distance between any two points in plan view increases, the number of pn diode connections increases. Therefore, even if a defect is generated in both the field insulating film 32 and the interlayer insulating film 34, as long as there is a certain distance between generation positions of the two defects, voltage can be divided by the pn diode, so that the occurrence of dielectric breakdown when high dV/dt is applied can be suppressed.

Further, as illustrated in FIGS. 28 and 29, since the dividing region 66 is provided only in a corner portion of each of the p-type regions 53A1 or each of the n-type regions 53A2, the area can be reduced as compared with the dividing region 65 in the MOSFET 102A of the variation of the second preferred embodiment. This makes it possible to suppress the occurrence of dielectric breakdown when high dV/dt is applied.

C-4. Effect

A plurality of regions into which the MOSFET 103 of the third preferred embodiment is divided in plan view include the temperature sense diode region 14 having a temperature sense diode made from polysilicon and the temperature sense pad region 16 having the temperature sense pad 8 electrically connected to the temperature sense diode. The field insulating film 32 is formed on an upper surface of the semiconductor layer in the gate pad region 13 and the temperature sense pad region 16. The etching stopper layer 53 is made from polysilicon and is formed on the field insulating film 32 of the gate pad region 13 and the temperature sense pad region 16. With the above configuration, also in the MOSFET 103 having the temperature sense diode, it is possible to suppress the occurrence of dielectric breakdown when high dV/dt is applied, as in the first preferred embodiment.

In the MOSFET 103A of the variation of the third preferred embodiment, the etching stopper layer 53A includes a plurality of the p-type regions 53A1 and a plurality of the n-type regions 53A2 alternately and repeatedly arranged. Then, the dividing region 66 made from an insulating film is provided between the p-type regions 53A1 adjacent to each other and between the n-type regions 53A2 adjacent to each other. With the above configuration, as illustrated in FIGS. 28 and 29, since the dividing region 66 is provided only in a corner portion of each of the p-type regions 53A1 or each of the n-type regions 53A2, the area of the region can be reduced. This makes it possible to suppress the occurrence of dielectric breakdown when high dV/dt is applied.

D. Fourth Preferred Embodiment

D-1. Configuration

Figure 30:
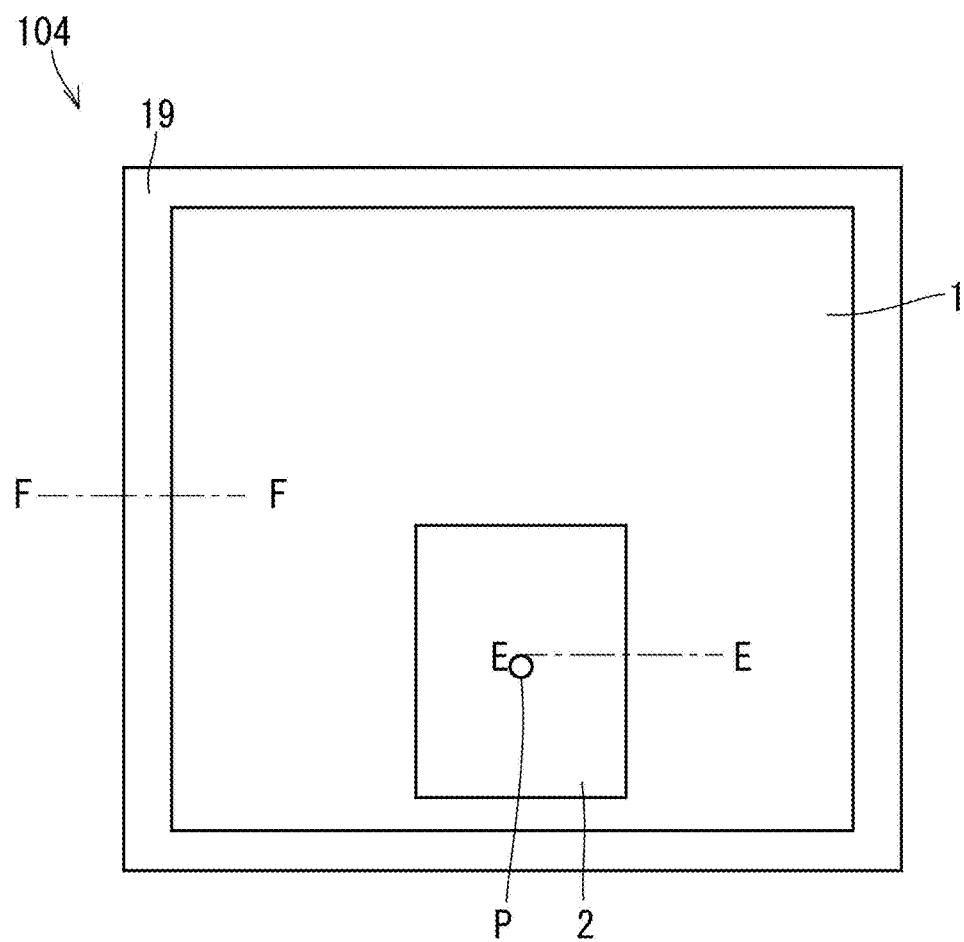
FIG. 30 is a plan view of the MOSFET in a fourth preferred embodiment.

FIG. 30 is a plan view of a MOSFET 104 that is a silicon carbide semiconductor device according to a fourth preferred embodiment. The MOSFET 104 includes the device region 11 and the under-gate well contact region 12 in which the source electrode 1 is formed, the gate pad region 13 in which the gate pad 2 is formed, and a termination region 19 on the outer periphery of a chip. Between the termination region 19 and the device region 11, there are a termination well contact region 17 and a gate wiring region 18.

Figure 31:
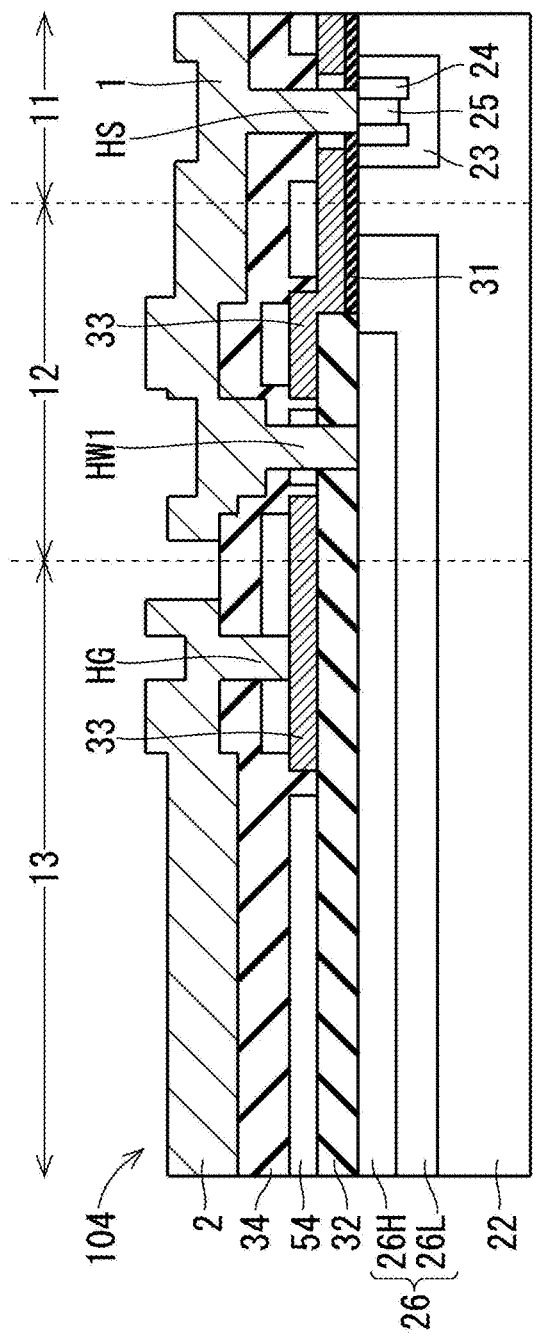
FIG. 31 is a cross-sectional view illustrating the device region, the under-gate well contact region, and the gate pad region of the MOSFET of the fourth preferred embodiment.
Figure 32:
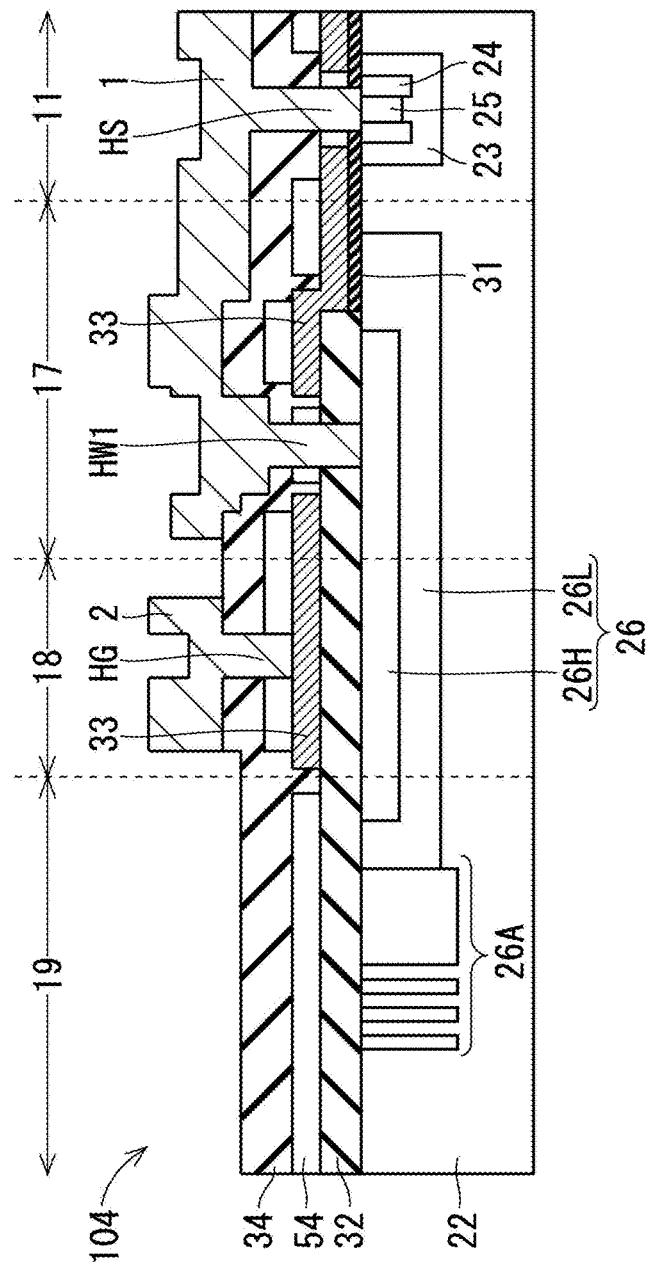
FIG. 32 is a cross-sectional view illustrating the device region, a termination well contact region, a gate wiring region, and a termination region of the MOSFET of the fourth preferred embodiment.

FIG. 31 is a cross-sectional view of the device region 11, the under-gate well contact region 12, and the gate pad region 13 of the MOSFET 104 taken along line E-E in FIG. 30. FIG. 32 is a cross-sectional view of the device region 11, the termination well contact region 17, the gate wiring region 18, and the termination region 19 of the MOSFET 104 taken along line F-F in FIG. 30. In the termination region 19, a p-type electric field relaxation layer 26A is provided on a surface layer of the drift layer 22.

The MOSFET 104 is different from the MOSFET 101 of the first preferred embodiment in that an etching stopper layer 54 made from silicon nitride (SiN) is provided instead of the etching stopper layer 51, and the etching stopper layer 54 is provided in the termination region 19 in addition to the gate pad region 13. The etching stopper layer 54 is different in material and physical property from the field insulating film 32 and the interlayer insulating film 34. The field insulating film 32 and the interlayer insulating film 34 are made from a CVD film such as SiO2 or TEOS.

On the silicon carbide semiconductor layer, dielectric breakdown does not occur even when a high electric field is applied inside. However, when an electric field on a surface of the silicon carbide semiconductor layer increases, hydrolysis is induced if there is moisture in the vicinity, and an oxide film is formed on a surface and rises, which may damage a film on the silicon carbide semiconductor layer. In this respect, the etching stopper layer 54 made from silicon nitride has high moisture resistance, and can suppress entry of moisture from the outside of the MOSFET 104. Therefore, as illustrated in FIG. 32, the etching stopper layer 54 is desirably installed in the termination region 19 of a chip where an electric field becomes high.

Figure 33:
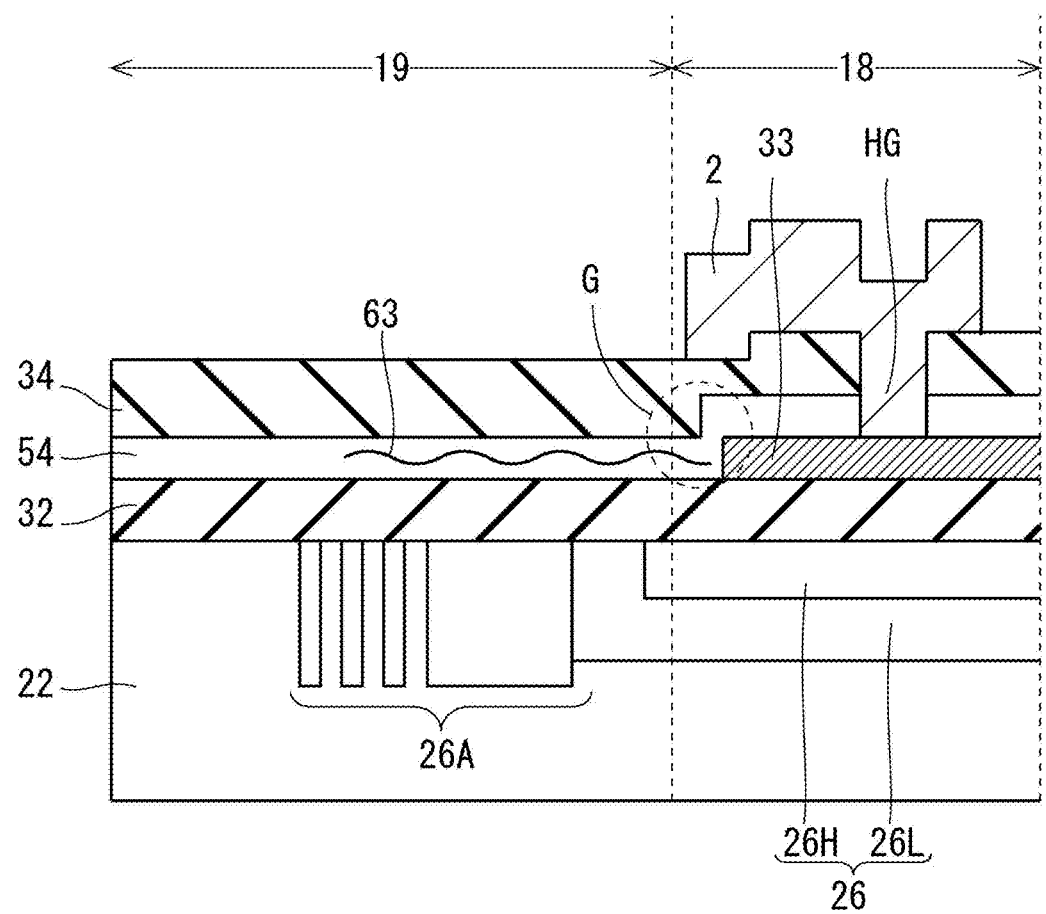
FIG. 33 is a cross-sectional view illustrating a state in which a crack occurs on the etching stopper layer formed on a step.

Since the etching stopper layer 54 is made from silicon nitride, a selectivity is high with respect to etching of the interlayer insulating film 34 and the field insulating film 32. Therefore, the etching stopper layer 54 is formed on a laminated film such as the field insulating film 32 or the gate electrode 33 formed before the etching stopper layer 54 with a step portion having an acute angle. Here, the step portion having an acute angle includes, for example, a step portion tapered or reversely tapered at a taper angle of 80° or more and less than 90°. FIG. 33 illustrates a state in which the etching stopper layer 54 is formed on a step between the gate electrode 33 and the field insulating film 32. Since the silicon nitride film is likely to be cracked, when the etching stopper layer 54 is formed on the step, stress is applied in a region G, and a crack 63 is likely to occur. Then, when the crack 63 progresses to a region of a high electric field, moisture enters the region of the high electric field, leading to breakage of the deposited film as described above. Therefore, the etching stopper layer 54 is desirably not formed on a step formed by a laminated film formed before the etching stopper layer 54, such as the field insulating film 32 or the gate electrode 33.

D-2. Effect

A plurality of regions into which the MOSFET 104 of the fourth preferred embodiment is divided in plan view include the termination region 19 surrounding the device region 11. The field insulating film 32 is formed on an upper surface of the semiconductor layer in the gate pad region 13 and the termination region 19. The etching stopper layer 54 is made from silicon nitride, and is formed on the field insulating film 32 in the gate pad region 13 and the termination region 19. With the above configuration, according to the MOSFET 104, the etching stopper layer 54 provided in the termination region 19 can suppress entry of moisture from the outside of the MOSFET 104.

Further, in the MOSFET 104, the etching stopper layer 54 is not formed on the step between the field insulating film 32 and the gate electrode 33. Therefore, a crack on the etching stopper layer 54 can be suppressed.

E. Fifth Preferred Embodiment

E-1. Configuration

Figure 34:
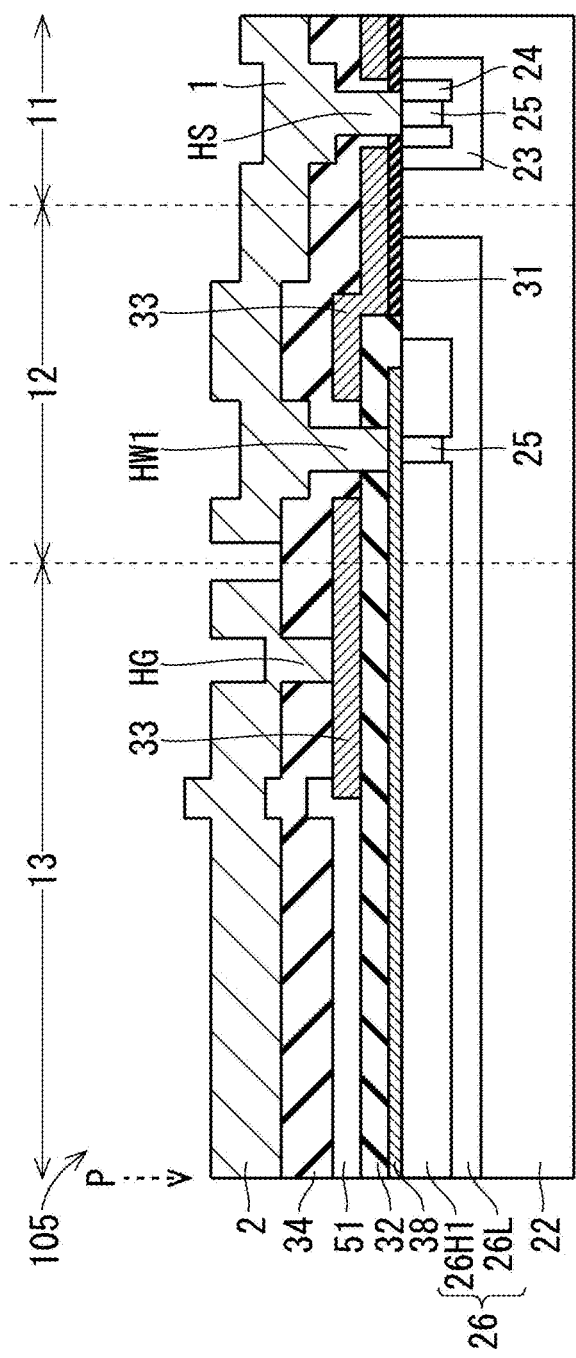
FIG. 34 is a plan view of the MOSFET in a fifth preferred embodiment.

FIG. 34 is a cross-sectional view of a MOSFET 105 that is a silicon carbide semiconductor device according to a fifth preferred embodiment. A plan view of the MOSFET 105 is as illustrated in FIG. 1 or 2. FIG. 34 illustrates a cross-sectional configuration taken along line A-A in FIG. 1 or line B-B in FIG. 2.

The MOSFET 105 includes an N+-type well contact region 26H1 instead of the P+-type well contact region 26H in the gate pad region 13 and the under-gate well contact region 12. Further, the MOSFET 105 includes a conductive film 38 on a surface of the semiconductor layer in the gate pad region 13 and the under-gate well contact region 12. Further, the MOSFET 105 includes the p-type well contact region 25 that penetrates the well contact region 26H1 and reaches the well body region 26L below the well contact hole HW1 in the under-gate well contact region 12. The MOSFET 105 is different from the MOSFET 101 of the first preferred embodiment in the above points.

The conductive film 38 is a metal film or the like having a resistivity lower than that of the semiconductor layer.

According to the above configuration, since the resistance of the conductive film 38 is small in the gate pad region 13 and the under-gate well contact region 12, displacement current easily flows, and an electric field itself applied to the insulating film is reduced when high dV/dt is applied. For this reason, even if a defect is generated in the field insulating film 32 or the interlayer insulating film 34, the occurrence of dielectric breakdown when high dV/dt is applied can be suppressed by the remaining film thickness.

In a case where the well contact region 26H1 is the p-type, bipolar operation is performed in the under-gate well contact region 12 depending on a use condition. Therefore, in a case where there is a lamination failure in the silicon carbide semiconductor layer, the failure grows to cause increase in on-resistance or increase in leakage current. In order to suppress such a defect, the well contact region 26H1 is the n-type.

E-2. Effect

In the MOSFET 105 according to the fifth preferred embodiment, the second well region 26 includes the p-type well body region 26L formed on a surface layer of the drift layer 22 and the n-type well contact region 26H1 formed on a surface layer of the well body region 26L. Further, the MOSFET 105 includes the conductive film 38 having a resistivity lower than that of the drift layer 22 on an upper surface of the well contact region 26H1. Therefore, since the resistance of the conductive film 38 is small in the gate pad region 13 and the under-gate well contact region 12, displacement current easily flows, and an electric field itself applied to the insulating film is reduced when high dV/dt is applied. For this reason, even if a defect is generated in the field insulating film 32 or the interlayer insulating film 34, the occurrence of dielectric breakdown when high dV/dt is applied can be suppressed by the remaining film thickness.

Note that, preferred embodiments can be freely combined with each other, and each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:

1. A silicon carbide semiconductor device divided into a plurality of regions including a device region in which a switching element is formed, a gate pad region in which a gate pad is formed, and an under-gate well contact region between the device region and the gate pad region in plan view, the silicon carbide semiconductor device comprising:
 a semiconductor layer made from silicon carbide, wherein the semiconductor layer includes:
 a drift layer of a first conductivity type; and
 a well region formed on a surface layer of the drift layer over the gate pad region and the under-gate well contact region, the silicon carbide semiconductor device further comprising:

a field insulating film formed on an upper surface of the semiconductor layer in the gate pad region and extending continuously underneath an entire length of the gate pad in a cross-sectional view, the field insulating film having a constant thickness across the entire length of the gate pad in the cross-sectional view;

a gate electrode and an etching stopper layer formed on the field insulating film in the gate pad region;

an interlayer insulating film formed on the gate electrode and the etching stopper layer;

a surface electrode that is formed on the interlayer insulating film in the under-gate well contact region and is in contact with the well region through a well contact hole penetrating the field insulating film and the interlayer insulating film; and the gate pad, which is formed on the interlayer insulating film in the gate pad region and is in contact with the gate electrode through a gate contact hole penetrating the interlayer insulating film, wherein the etching stopper layer is provided at a position farthest from the well contact hole in the under-gate well contact region at least in the gate pad region.

2. The silicon carbide semiconductor device according to claim 1, wherein the etching stopper layer is made from a same material as the gate electrode.

3. The silicon carbide semiconductor device according to claim 2, wherein the etching stopper layer is separated from the gate electrode by an insulating film.

4. The silicon carbide semiconductor device according to claim 3, wherein the etching stopper layer is divided into a plurality of regions by an insulating film.

5. The silicon carbide semiconductor device according to claim 1, wherein the plurality of regions include a temperature sense diode region having a temperature sense diode made from polysilicon and a temperature sense pad region having a temperature sense pad electrically connected to the temperature sense diode, the field insulating film is formed on an upper surface of the semiconductor layer in the gate pad region and the temperature sense pad region, and the etching stopper layer is made from polysilicon and is formed on the field insulating film of the gate pad region and the temperature sense pad region.

6. The silicon carbide semiconductor device according to claim 5, wherein the etching stopper layer includes a plurality of p-type regions and a plurality of n-type regions that are alternately and repeatedly arranged, and a dividing region made from an insulating film is provided between the p-type regions adjacent to each other and between the n-type regions adjacent to each other.

7. The silicon carbide semiconductor device according to claim 1, wherein the plurality of regions include a termination region surrounding the device region, the field insulating film is formed on an upper surface of the semiconductor layer in the gate pad region and the termination region, and the etching stopper layer is made from silicon nitride, and is formed on the field insulating film in the gate pad region and the termination region.

8. The silicon carbide semiconductor device according to claim 7, wherein the etching stopper layer is not formed on a step between the field insulating film and the gate electrode.

9. The silicon carbide semiconductor device according to claim 1, wherein the well region includes:

a p-type well body region formed on a surface layer of the drift layer; and an n-type well contact region formed on a surface layer of the well body region, the silicon carbide semiconductor device further comprising:

a conductive film having a resistivity lower than a resistivity of the drift layer on an upper surface of the well contact region.

10. A method for manufacturing a silicon carbide semiconductor device that is divided into a plurality of regions including a device region in which a switching element is formed, a gate pad region in which a gate pad is formed, and an under-gate well contact region between the device region and the gate pad region in plan view, the method comprising:

forming a semiconductor layer including a drift layer made from n-type silicon carbide;

forming a well region on a surface layer of the drift layer over the gate pad region and the under-gate well contact region;

forming a field insulating film formed on an upper surface of the semiconductor layer in the gate pad region and extending continuously underneath an entire length of the gate pad in a cross-sectional view, the field insulating film having a constant thickness across the entire length of the gate pad in the cross-sectional view;

forming a gate electrode and an etching stopper layer on the field insulating film in the gate pad region;

forming an interlayer insulating film on the gate electrode and the etching stopper layer;

forming a surface electrode on the interlayer insulating film in the under-gate well contact region, the surface electrode being in contact with the well region through a well contact hole penetrating the field insulating film and the interlayer insulating film; and forming the gate pad on the interlayer insulating film in the gate pad region, the gate pad being in contact with the gate electrode through a gate contact hole penetrating the interlayer insulating film, wherein the etching stopper layer is formed at a position farthest from the well contact hole in the under-gate well contact region at least in the gate pad region.

11. A silicon carbide semiconductor device divided into a plurality of regions including a device region in which a switching element is formed, a gate pad region in which a gate pad is formed, and an under-gate well contact region between the device region and the gate pad region in plan view, the silicon carbide semiconductor device comprising:

a semiconductor layer made from silicon carbide, wherein the semiconductor layer includes:

a drift layer of a first conductivity type; and a well region formed on a surface layer of the drift layer over the gate pad region and the under-gate well contact region, the silicon carbide semiconductor device further comprising:

a field insulating film formed on an upper surface of the semiconductor layer in the gate pad region;

a gate electrode and an etching stopper layer formed on the field insulating film in the gate pad region;

an interlayer insulating film formed on the gate electrode and the etching stopper layer;

a surface electrode that is formed on the interlayer insulating film in the under-gate well contact region and is in contact with the well region through a well contact hole penetrating the field insulating film and the interlayer insulating film; and the gate pad, which is formed on the interlayer insulating film in the gate pad region and is in contact with the gate electrode through a gate contact hole penetrating the interlayer insulating film, wherein the etching stopper layer is provided at a position farthest from the well contact hole in the under-gate well contact region at least in the gate pad region, the etching stopper layer is made from a same material as the gate electrode, and the etching stopper layer is separated from the gate electrode by an insulating film.

12. The silicon carbide semiconductor device according to claim 11, wherein the etching stopper layer is divided into a plurality of regions by an insulating film.

13. A silicon carbide semiconductor device divided into a plurality of regions including a device region in which a switching element is formed, a gate pad region in which a gate pad is formed, and an under-gate well contact region between the device region and the gate pad region in plan view, the silicon carbide semiconductor device comprising:

a semiconductor layer made from silicon carbide, wherein the semiconductor layer includes:

a drift layer of a first conductivity type; and a well region formed on a surface layer of the drift layer over the gate pad region and the under-gate well contact region, the silicon carbide semiconductor device further comprising:

a field insulating film formed on an upper surface of the semiconductor layer in the gate pad region;

a gate electrode and an etching stopper layer formed on the field insulating film in the gate pad region;

an interlayer insulating film formed on the gate electrode and the etching stopper layer;

a surface electrode that is formed on the interlayer insulating film in the under-gate well contact region and is in contact with the well region through a well contact hole penetrating the field insulating film and the interlayer insulating film; and the gate pad, which is formed on the interlayer insulating film in the gate pad region and is in contact with the gate electrode through a gate contact hole penetrating the interlayer insulating film, wherein the etching stopper layer is provided at a position farthest from the well contact hole in the under-gate well contact region at least in the gate pad region, the plurality of regions include a temperature sense diode region having a temperature sense diode made from polysilicon and a temperature sense pad region having a temperature sense pad electrically connected to the temperature sense diode, the field insulating film is formed on an upper surface of the semiconductor layer in the gate pad region and the temperature sense pad region, and the etching stopper layer is made from polysilicon and is formed on the field insulating film of the gate pad region and the temperature sense pad region.

14. The silicon carbide semiconductor device according to claim 13, wherein the etching stopper layer includes a plurality of p-type regions and a plurality of n-type regions that are alternately and repeatedly arranged, and a dividing region made from an insulating film is provided between the p-type regions adjacent to each other and between the n-type regions adjacent to each other.

15. A silicon carbide semiconductor device divided into a plurality of regions including a device region in which a switching element is formed, a gate pad region in which a gate pad is formed, and an under-gate well contact region between the device region and the gate pad region in plan view, the silicon carbide semiconductor device comprising:

a semiconductor layer made from silicon carbide, wherein the semiconductor layer includes:

a drift layer of a first conductivity type; and a well region formed on a surface layer of the drift layer over the gate pad region and the under-gate well contact region, the silicon carbide semiconductor device further comprising:

a field insulating film formed on an upper surface of the semiconductor layer in the gate pad region;

a gate electrode and an etching stopper layer formed on the field insulating film in the gate pad region;

an interlayer insulating film formed on the gate electrode and the etching stopper layer;

a surface electrode that is formed on the interlayer insulating film in the under-gate well contact region and is in contact with the well region through a well contact hole penetrating the field insulating film and the interlayer insulating film; and the gate pad, which is formed on the interlayer insulating film in the gate pad region and is in contact with the gate electrode through a gate contact hole penetrating the interlayer insulating film, wherein the etching stopper layer is provided at a position farthest from the well contact hole in the under-gate well contact region at least in the gate pad region, the plurality of regions include a termination region surrounding the device region, the field insulating film is formed on an upper surface of the semiconductor layer in the gate pad region and the termination region, and the etching stopper layer is made from silicon nitride, and is formed on the field insulating film in the gate pad region and the termination region.

16. The silicon carbide semiconductor device according to claim 15, wherein the etching stopper layer is not formed on a step between the field insulating film and the gate electrode.

17. A silicon carbide semiconductor device divided into a plurality of regions including a device region in which a switching element is formed, a gate pad region in which a gate pad is formed, and an under-gate well contact region between the device region and the gate pad region in plan view, the silicon carbide semiconductor device comprising:

a semiconductor layer made from silicon carbide, wherein the semiconductor layer includes:

a drift layer of a first conductivity type; and a well region formed on a surface layer of the drift layer over the gate pad region and the under-gate well contact region, the silicon carbide semiconductor device further comprising:

a field insulating film formed on an upper surface of the semiconductor layer in the gate pad region;

a gate electrode and an etching stopper layer formed on the field insulating film in the gate pad region;

an interlayer insulating film formed on the gate electrode and the etching stopper layer;

a surface electrode that is formed on the interlayer insulating film in the under-gate well contact region and is in contact with the well region through a well contact hole penetrating the field insulating film and the interlayer insulating film; and the gate pad, which is formed on the interlayer insulating film in the gate pad region and is in contact with the gate electrode through a gate contact hole penetrating the interlayer insulating film, wherein the etching stopper layer is provided at a position farthest from the well contact hole in the under-gate well contact region at least in the gate pad region, the well region includes:

a p-type well body region formed on a surface layer of the drift layer; and an n-type well contact region formed on a surface layer of the well body region, and the silicon carbide semiconductor device further comprising:

a conductive film having a resistivity lower than a resistivity of the drift layer on an upper surface of the well contact region.

\* \* \* \* \*